United States Patent
Rabkin et al.

(10) Patent No.: US 8,557,654 B2
(45) Date of Patent: Oct. 15, 2013

(54) PUNCH-THROUGH DIODE

(75) Inventors: Peter Rabkin, Cupertino, CA (US); Andrei Mihnea, San Jose, CA (US)

(73) Assignee: SanDisk 3D LLC, Milpitas, CA (US)

( * ) Notice: Subject to any disclaimer, the term of this patent is extended or adjusted under 35 U.S.C. 154(b) by 395 days.

(21) Appl. No.: 12/966,735

(22) Filed: Dec. 13, 2010

(65) Prior Publication Data

US 2012/0145984 A1   Jun. 14, 2012

(51) Int. Cl.
*H01L 21/329* (2006.01)
*H01L 21/33* (2006.01)
*H01L 27/02* (2006.01)
H01L 23/60 (2006.01)
H01L 23/62 (2006.01)

(52) U.S. Cl.
CPC .................. *H01L 27/0255* (2013.01)
USPC ........... 438/237; 438/141; 257/355; 257/362; 257/497; 257/E29.332

(58) Field of Classification Search
CPC .................................. H01L 27/0255
USPC ................. 257/355–356, 360–362, 497–498, 257/E29.332, E29.063; 438/141, 237, 328
See application file for complete search history.

(56) References Cited

U.S. PATENT DOCUMENTS

| | | | |
|---|---|---|---|
| 4,405,932 A * | 9/1983 | Ishii et al. ...................... 257/497 |
| 5,122,889 A | 6/1992 | Kaneko et al. |
| 5,147,775 A * | 9/1992 | Ota et al. ........................ 438/317 |
| 5,880,511 A * | 3/1999 | Yu et al. ......................... 257/497 |
| 5,937,318 A * | 8/1999 | Warner et al. .................. 438/505 |
| 6,015,999 A * | 1/2000 | Yu et al. .......................... 257/497 |
| 6,118,155 A * | 9/2000 | Voldman ........................ 257/360 |
| 6,376,897 B2 * | 4/2002 | Yamada et al. ................. 257/557 |
| 6,384,431 B1 * | 5/2002 | Takahashi et al. ............. 257/147 |
| 6,489,660 B1 | 12/2002 | Einthoven et al. |
| 6,579,760 B1 | 6/2003 | Lung |
| 6,597,052 B2 | 7/2003 | Hurkx et al. |
| 6,753,561 B1 | 6/2004 | Rinerson et al. |
| RE38,608 E * | 10/2004 | Yu et al. .......................... 257/497 |
| 6,900,853 B2 * | 5/2005 | Watanabe et al. ............... 349/43 |
| 7,009,694 B2 | 3/2006 | Hart et al. |
| 7,271,081 B2 | 9/2007 | Li et al. |
| 7,303,971 B2 | 12/2007 | Hsu et al. |
| 7,446,010 B2 | 11/2008 | Li et al. |
| 7,573,080 B1 * | 8/2009 | Huang et al. ................... 257/198 |
| 7,816,659 B2 * | 10/2010 | Herner et al. ...................... 257/2 |

(Continued)

OTHER PUBLICATIONS

U.S. Appl. No. 12/582,509, filed Oct. 20, 2009.

*Primary Examiner* — Matthew Landau
*Assistant Examiner* — Maliheh Malek
(74) *Attorney, Agent, or Firm* — Vierra Magen Marcus LLP

(57) ABSTRACT

A punch-through diode and method of fabricating the same are disclosed herein. The punch-through diode may be used as a steering element in a memory device having a reversible resistivity-switching element. For example, a memory cell may include a reversible resistivity-switching element in series with a punch-through diode. The punch-through diode allows bipolar operation of a cross-point memory array. The punch-through diode may have a symmetrical non-linear current/voltage relationship. The punch-through diode has a high current at high bias for selected cells and a low leakage current at low bias for unselected cells. In other words, the ratio of Ion/Ioff is high. Therefore, the punch-through diode is compatible with bipolar switching in cross-point memory arrays having resistive switching elements.

17 Claims, 20 Drawing Sheets

(56) References Cited

U.S. PATENT DOCUMENTS

| | | | |
|---|---|---|---|
| 7,821,099 B2* | 10/2010 | Voldman | 257/516 |
| 8,030,731 B2* | 10/2011 | Williams et al. | 257/510 |
| 8,216,862 B2* | 7/2012 | Kreupl et al. | 438/17 |
| 8,274,130 B2* | 9/2012 | Mihnea et al. | 257/497 |
| 8,288,839 B2* | 10/2012 | Guan et al. | 257/493 |
| 8,324,611 B2* | 12/2012 | Kaneko et al. | 257/15 |
| 2001/0054746 A1* | 12/2001 | Yamada et al. | 257/565 |
| 2006/0250837 A1* | 11/2006 | Herner et al. | 365/148 |
| 2007/0010094 A1 | 1/2007 | Kreupl et al. | |
| 2007/0015330 A1 | 1/2007 | Li et al. | |
| 2007/0015348 A1 | 1/2007 | Hsu et al. | |
| 2007/0114508 A1* | 5/2007 | Herner et al. | 257/2 |
| 2007/0114509 A1* | 5/2007 | Herner | 257/4 |
| 2007/0132049 A1* | 6/2007 | Stipe | 257/421 |
| 2007/0228414 A1* | 10/2007 | Kumar et al. | 257/183 |
| 2008/0192395 A1* | 8/2008 | Albers et al. | 361/56 |
| 2008/0239790 A1* | 10/2008 | Herner et al. | 365/151 |
| 2008/0315260 A1* | 12/2008 | Duane | 257/212 |
| 2009/0183774 A1* | 7/2009 | Atanackovic | 136/261 |
| 2010/0085794 A1* | 4/2010 | Chen et al. | 365/148 |
| 2010/0099242 A1* | 4/2010 | Fedeli | 438/513 |
| 2010/0265750 A1* | 10/2010 | Yan et al. | 365/51 |
| 2010/0276779 A1* | 11/2010 | Guan et al. | 257/492 |
| 2011/0085370 A1* | 4/2011 | Chen et al. | 365/148 |
| 2011/0089391 A1* | 4/2011 | Mihnea et al. | 257/2 |
| 2011/0122676 A1* | 5/2011 | Murooka et al. | 365/148 |
| 2011/0204316 A1* | 8/2011 | Kreupl et al. | 257/5 |
| 2011/0227024 A1* | 9/2011 | Sekar et al. | 257/4 |
| 2011/0229990 A1* | 9/2011 | Kreupl et al. | 438/17 |
| 2011/0266593 A1* | 11/2011 | Hsieh | 257/139 |
| 2011/0310653 A1* | 12/2011 | Kreupl et al. | 365/148 |
| 2012/0012933 A1* | 1/2012 | Cheng et al. | 257/347 |
| 2012/0049242 A1* | 3/2012 | Atanackovic et al. | 257/184 |
| 2012/0061639 A1* | 3/2012 | Yasuda | 257/2 |
| 2012/0063245 A1* | 3/2012 | Sonehara | 365/189.16 |
| 2012/0074367 A1* | 3/2012 | Costa et al. | 257/2 |
| 2012/0077318 A1* | 3/2012 | Purayath et al. | 438/129 |
| 2012/0091419 A1* | 4/2012 | Chen et al. | 257/4 |
| 2012/0147653 A1* | 6/2012 | Chung | 365/103 |
| 2012/0159995 A1* | 6/2012 | Borel et al. | 65/397 |
| 2012/0175699 A1* | 7/2012 | Hsieh | 257/332 |
| 2012/0276744 A1* | 11/2012 | Nguyen et al. | 438/702 |
| 2012/0302029 A1* | 11/2012 | Mihnea et al. | 438/382 |
| 2012/0329238 A1* | 12/2012 | Guan et al. | 438/400 |
| 2013/0009167 A1* | 1/2013 | Tan et al. | 257/77 |

* cited by examiner

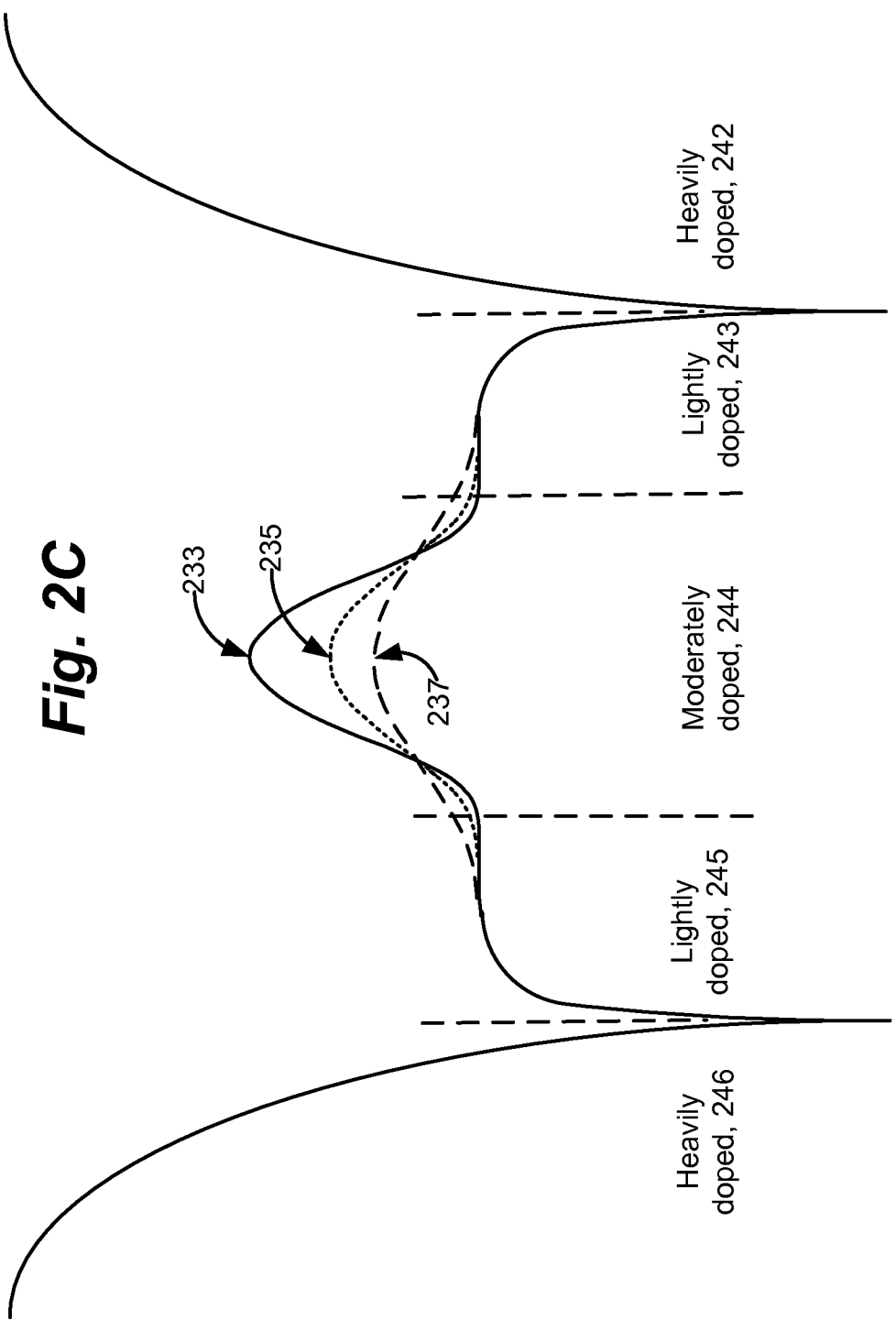

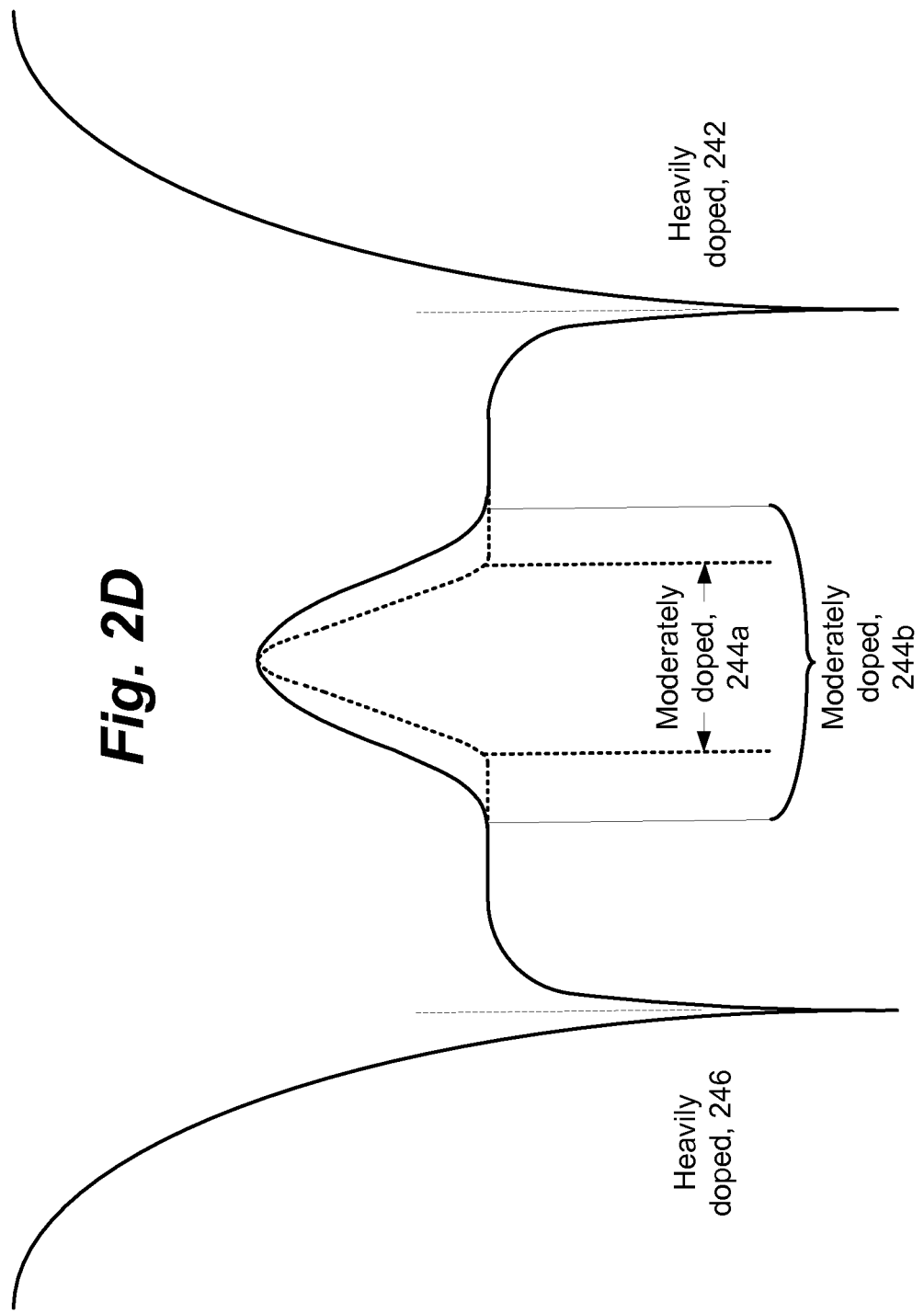

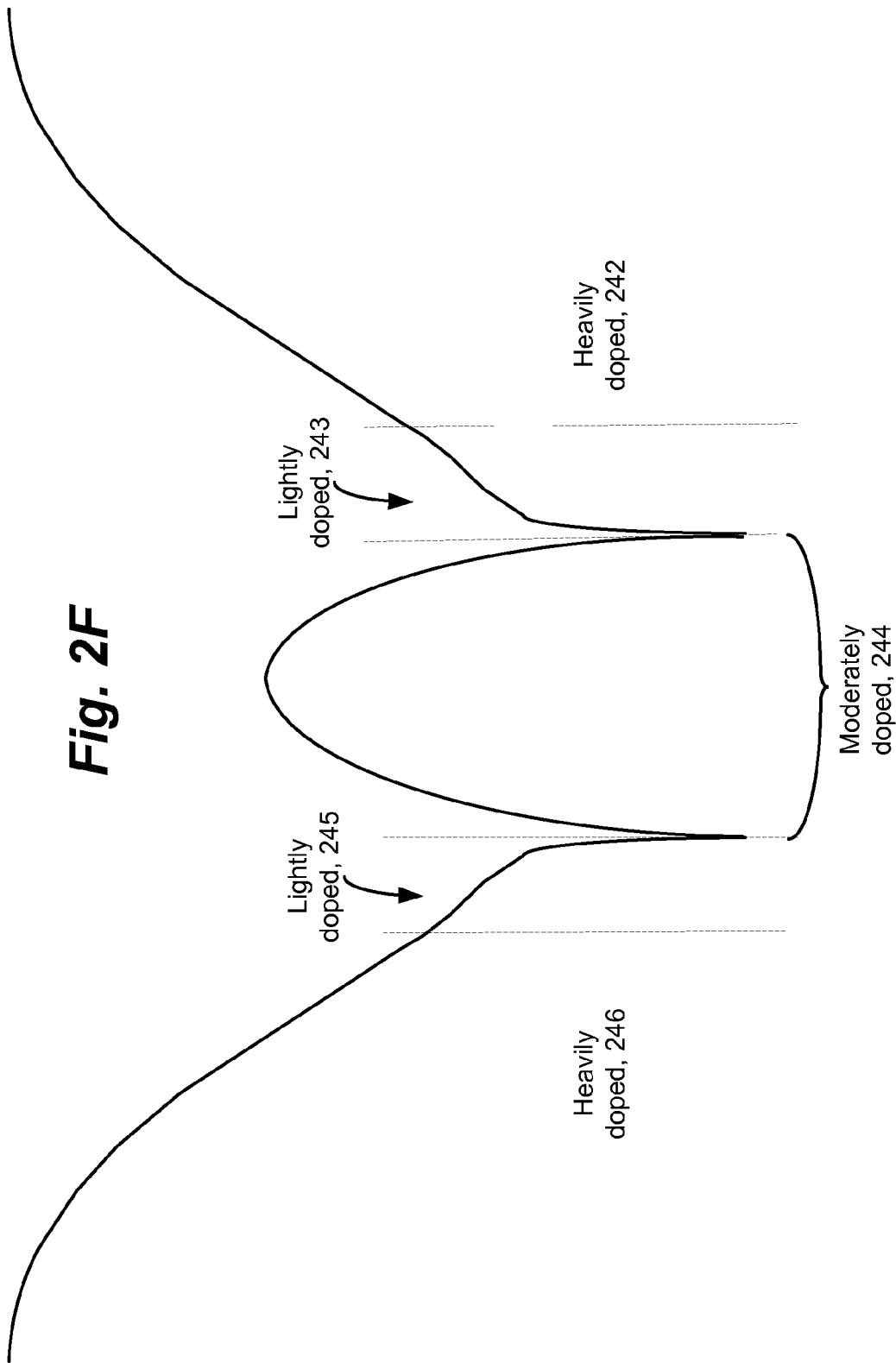

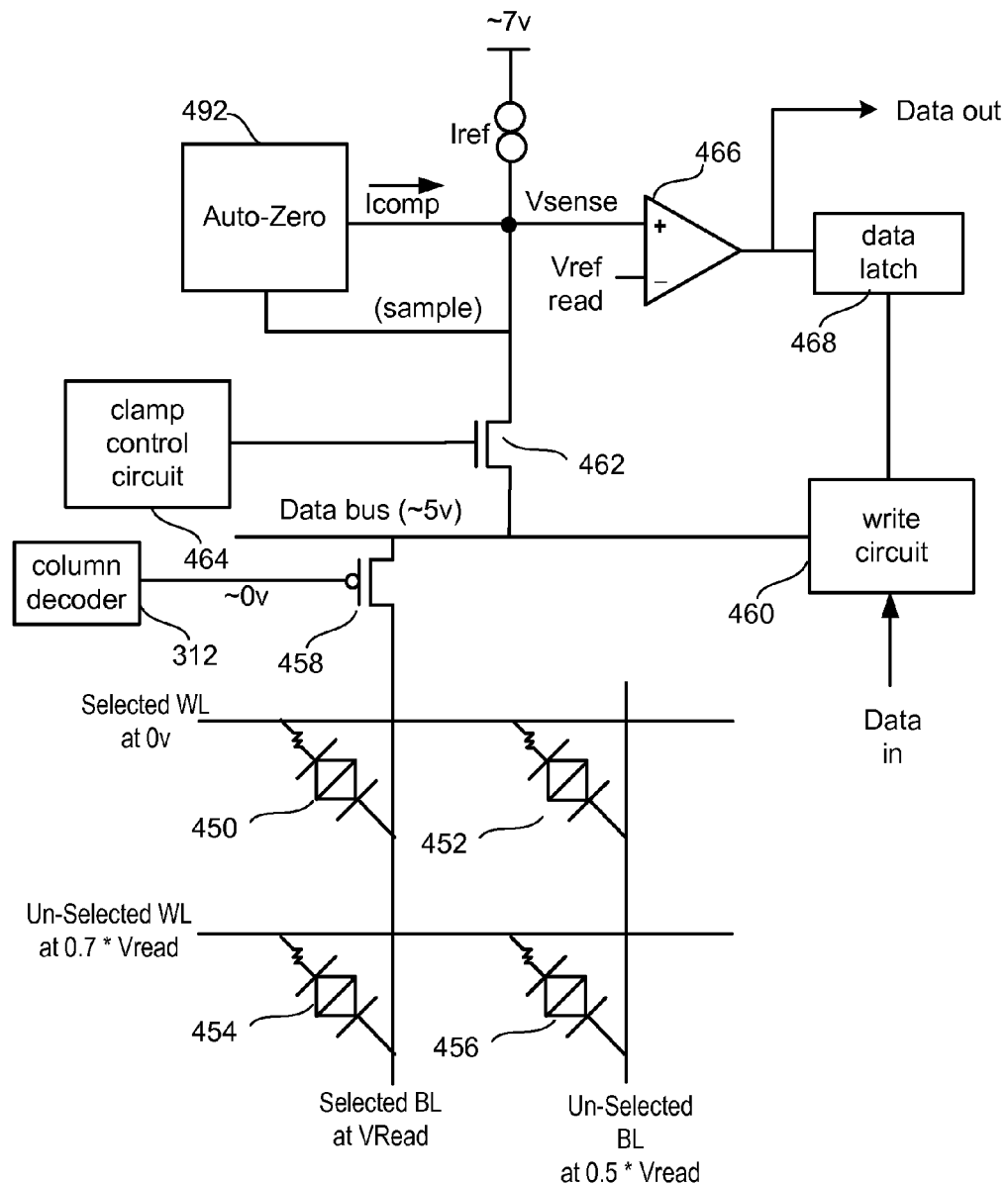

PUNCH-THROUGH DIODE

BACKGROUND

1. Field

This disclosure relates to technology for non-volatile data storage.

2. Description of the Related Art

A variety of materials show reversible resistivity-switching behavior, and as such may be suitable for use as memory elements. One type of material having reversible resistivity-switching behavior is referred to as resistance change memory (ReRAM). Transition metal oxides have been proposed for ReRAM. A second type of material having reversible resistivity-switching behavior is referred to as phase change memory (PCRAM). Chalcogenides, which may change between a crystalline state (conductor) and an amorphous state (insulator), have been proposed for PCRAM. Other materials such as carbon polymers, perovskites, and nitrides have also been proposed as memory elements having reversible resistivity-switching behavior.

Upon application of sufficient voltage, current, or other stimulus, the reversible resistivity-switching material switches to a stable high-resistance state. This resistivity-switching is reversible such that subsequent application of an appropriate voltage, current, or other stimulus can serve to return the reversible resistivity-switching material to a stable low-resistance state. This conversion can be repeated many times. For some switching materials, the initial state is high-resistance rather than low-resistance.

These switching materials are of interest for use in non-volatile memory arrays. One type of memory array is referred to as a cross-point array, which is a matrix of memory elements typically arranged along x-axes (e.g., word lines) and along y-axes (e.g., bit lines). In some aspects, a digital value is stored as a memory resistance (high or low). The memory state of a memory cell can read by supplying a voltage to the bit line or/and word line connected to the selected memory element. The resistance or memory state can be read as an output voltage or current of the bit line connected to the selected memory cell. One resistance state may correspond to a data "0," for example, while the other resistance state corresponds to a data "1." Some switching materials may have more than two stable resistance states.

Non-volatile memories formed from reversible resistivity-switching elements are known. For example, U.S. Patent Application Publication 2006/0250836, filed May 9, 2005 and titled "Rewriteable Memory Cell Comprising A Diode And A Resistivity-Switching Material," which is hereby incorporated by reference herein in its entirety, describes a rewriteable non-volatile memory cell that includes a diode coupled in series with a reversible resistivity-switching material such as a metal oxide or metal nitride. Such memory cells can be programmed by applying one or more programming signals to cause the reversible resistivity-switching to change from a low resistance state to a high resistance state, which may be referred to as RESETTING the memory cell. Similarly, the memory cells can be programmed by applying one or more programming signals to cause the reversible resistivity-switching to change from the high resistance state to the low resistance state, which may be referred to as SETTING the memory cell.

Both unipolar and bipolar modes of operation of the cross-point memory arrays have been proposed. In bipolar operation, the high resistance state is established by applying a voltage having one polarity and the low resistance state is established by applying a voltage having the opposite polarity. In unipolar operation, the high resistance state and low resistance state are established by applying voltage of the same polarity.

Some memory arrays use a steering device in series with the reversible resistivity-switching element to control the current flow for SET and RESET. That is, with a cross-point memory array some memory cells are selected for programming or reading, whereas many others are unselected and therefore should not be programmed or read during the present operation. The steering element helps to control which memory cells get programmed or read during a given operation. An example of a steering element is a p-i-n diode placed in series with each reversible resistivity-switching element. With appropriate voltages applied to the bit lines and word lines, each memory element can be separately programmed and read. However, with a p-i-n diode typically only unipolar switching is possible. However, unipolar operation may suffer from problems such as requirement of a high RESET current.

One proposal for bipolar operation of cross-point memory arrays is to place a metal/insulator/metal (MIM) diode in series with the resistive memory cell. However, it can be difficult to fabricate MIM diodes having desirable properties such as a sufficiently high forward bias current.

BRIEF DESCRIPTION OF THE DRAWINGS

FIGS. 2A, 2B, 2C, 2D, 2E, 2F, and 2G depict net doping profiles for embodiments of punch-through diodes.

FIG. 12 depicts a circuit that can read the state of a memory cell.

DETAILED DESCRIPTION

Figure 1:
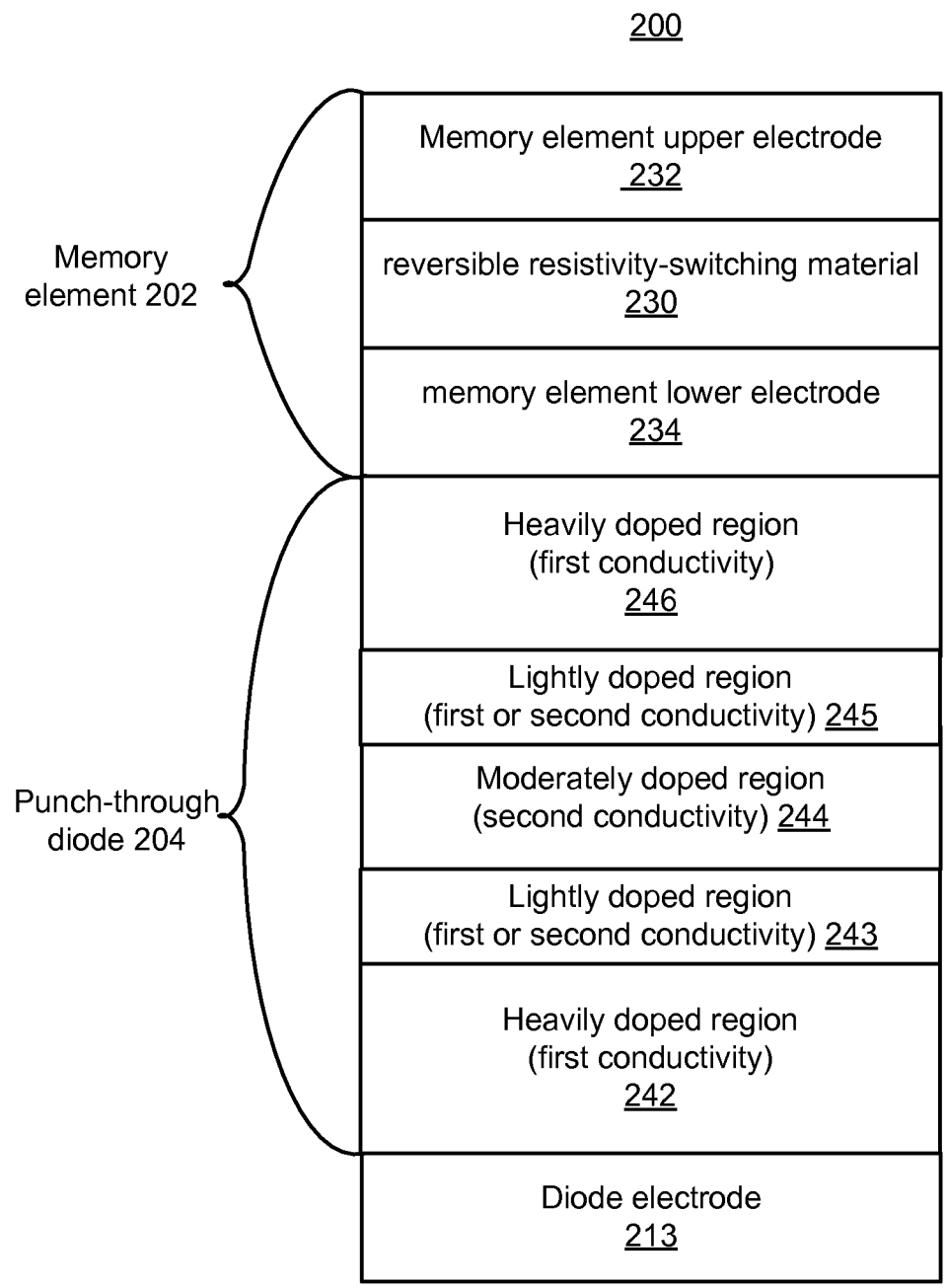
FIG. 1 is a diagram of one embodiment of a memory cell having a punch-through diode in series with a reversible resistivity-switching element.

A punch-through diode and method of fabricating the same are disclosed herein. The punch-through diode may be used as a steering element in a memory device having memory cells with reversible resistivity-switching elements. For example, a memory cell may include a reversible resistivity-switching element in series with a punch-through diode. The punch-through diode allows bipolar operation of a cross-point memory array. The punch-through diode may have a symmetrical non-linear current/voltage relationship. The punch-through diode may have a high current at high bias for selected memory cells and a low leakage current at low bias for unselected memory cells. In other words, the ratio of Ion/Ioff may be high. Therefore, the punch-through diode is compatible with bipolar switching in cross-point memory arrays having resistive switching elements. However, note that embodiments of a punch-through diode disclosed herein may have other applications.

In one embodiment, the punch-through diode is an N+/p−/p/p−/N+ device. For example, the diode has a base region that includes a non-uniform doping profile of a moderately doped region (p) between two lightly doped regions (p−). The lightly doped regions (which may be adjacent the p-n junctions) may result in a doping profile that reduces the peak electric field at the p-n junctions. This, in turn, may reduce band-to-band (BTB) tunneling, which may reduce leakage current. Reducing leakage current may reduce Ioff. The doping profile in the moderately doped region may be calculated to control the onset of punch-through conduction. For example, a higher doping concentration may delay the onset of punch-through conduction (e.g., may cause punch-through conduction to occur at a higher bias voltage). On the other hand, a lower doping concentration may cause punch-through conduction to occur at a lower applied voltage. Controlling the onset of punch-through conduction may be used to improve Ion/Ioff. Further details will be discussed below.

One embodiment includes a punch-through diode that is a P+/n−/n/n−/P+ device. This device may have a base region that includes a non-uniform doping profile of a moderately doped region (n) between two lightly doped regions (n−). This device may be similar to the N+/p−/p/p−/N+ device and may have similar properties. However, a difference may be whether electrons or holes are injected during operation. Since there may be some difference in the mobility of electrons versus holes, the devices may have some performance differences.

In one embodiment, the punch-through diode is an N+/n−/p/n−/N+ device. In this embodiment, the doping profile in the p-region may be used to control the onset of punch-through conduction. For example, a higher doping concentration may delay the onset of punch-through conduction. The lightly doped regions (n−) may result in a doping profile that serves to reduce the peak electric field at the p-n junctions. As a result, BTB tunneling may be reduced. Moreover, the leakage current (and therefore Ioff) may be reduced as a result of the doping profile. In one embodiment, the punch-through diode is a P+/p−/n/p−/P+ device.

Note that the lightly doped regions of the punch-through diode may be formed by intentional doping or, in some cases, without intentionally doping. For example, there may be background impurities that are introduced unintentionally during device fabrication. In some cases, the level of unintentional doping may be suitable for the lightly doped regions of the diode.

In some embodiments, a punch-through diode is used in a memory cell as a steering element in series with a reversible resistivity-switching element. FIG. 1 depicts one embodiment of a memory cell 200 having a punch-through diode 204 in series with a memory element 202. In this manner, the memory cell 200 may be used as part of a two or three dimensional memory array and data may be written to and/or read from the memory cell 200 without affecting the state of other memory cells in the array. Example memory arrays are discussed below.

In FIG. 1, the punch-through diode 204 includes two regions 242, 246 that include a semiconductor having first type of conductivity and a heavy doping concentration. For example, regions 242, 246 are heavily-doped with a material having the first type of conductivity. The diode 204 has a semiconductor region 244 having a second type of conductivity and a moderate doping concentration. For example, region 244 is moderately-doped with a material having the second type of conductivity (that is opposite the first type of conductivity). The diode 204 also has two semiconductor regions 243, 245 having either the first or the second type of conductivity and a low net doping concentration. Lightly doped regions 243, 245 may be formed by intentionally doping or without intentionally doping those regions 243, 245. One lightly doped region 243 is between the moderately-doped region 244 and one of the heavily-doped regions 242. The other lightly doped region 243 is between the moderately-doped region 244 and the other heavily-doped region 246. The lightly doped regions 243, 245 may be doped (intentionally or unintentionally) with either the first type or the second type of conductivity. There is also a diode electrode 213 depicted on one side of the diode 204. The diode electrode 213 may serve as an electrical contact to an element that connects the memory cell 200 with other memory cells, such as a bit line or word line. In one embodiment, the diode electrode 213 is formed from TiN.

The memory cell 200 has a memory element 202 that includes a reversible resistivity-switching material 230, an upper electrode 232, and a lower electrode 234. In one embodiment, the reversible resistivity-switching material 230 is a metal-oxide. In one embodiment, the memory cell electrodes 232, 234 are formed from TiN. Note that the relative positions of the diode 204 and the memory element 202 could be reversed. For example, the diode 204 could be above the memory element 202.

In some embodiments, the punch-through diode 204 may be formed from a polycrystalline semiconductor material such as polysilicon, germanium, or another semiconductor. Also, the punch-through diode 204 may comprise more than one type of semiconductor. For example, the punch-through diode 204 may be formed from a polycrystalline silicon-germanium alloy, polygermanium or any other suitable combination of semiconductors. In some embodiments, each region 242, 243, 244, 245, 246 of the punch-through diode 204 is formed from the same material (but doped differently). However, it is not required that each region be formed from the same material. For example, a heterostructure may be possible.

FIGS. 1A-1D depict embodiments of punch-through diodes 204. Each of the diodes 204 in FIGS. 1A-1D is one example of the diode 204 of FIG. 1. Thus, the reference numerals used in FIGS. 1A-1D correspond to the reference numerals used in FIG. 1. In the diode 204 of FIG. 1A, the two heavily doped regions 242, 246 are N+, the two lightly doped regions 243, 245 are p−, and the moderately doped region 244 is p− type. The semiconductor could be silicon, as one example. An example doping concentration for the N+ regions 242, 246 is $1.0\times10^{21}/cm^3$. An example range of doping concentrations for the moderately doped region 244 is between $1.0\times10^{18}/cm^3$ and $8.0\times10^{18}/cm^3$. An example doping concentration for the lightly doped regions 243, 345 is $5.0\times10^{17}/cm^3$. As noted above, the lightly doped regions 243, 245 may be intentionally or unintentionally doped. All doping concentrations and ranges could be higher or lower. In some embodiments, there may be some diffusion of the impurities. For example, the aforementioned doping concentrations may, in some embodiments, be peak doping concentrations. During fabrication, process steps such as thermal anneals may cause some diffusion such that the region has some variance in doping concentration. Therefore, it will be understood that the doping concentration is not necessarily uniform in a given region. Further details and examples are discussed below.

Figure 1A:
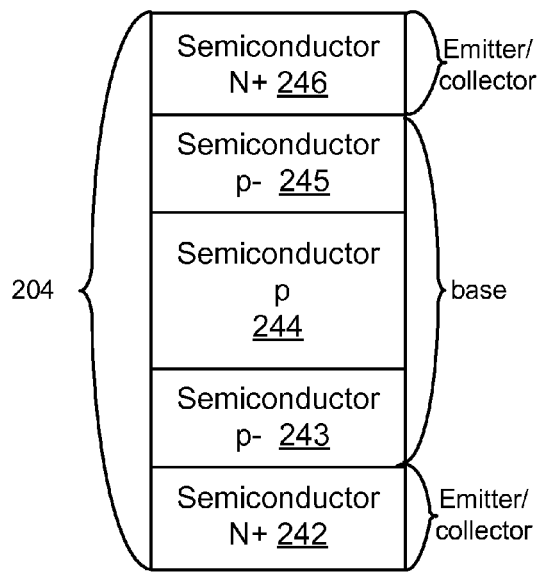
FIGS. 1A, 1B, 1C, and 1D are diagrams of embodiments of punch-through diodes.
Figure 1B:
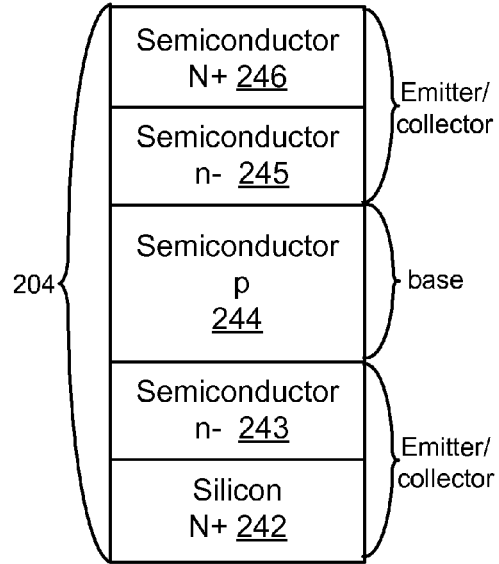

In FIG. 1B, the diode 204 has two N+ regions 242, 246, two n− regions 243, 245, and a p region 244. The semiconductor could be silicon, as one example. An example doping concentration for the N+ regions 242, 246 is $1.0\times10^{21}/cm^3$. An example range of doping concentrations for the p region 244 is between $3.0\times10^{18}/cm^3$ and $9.0\times10^{18}/cm^3$. An example doping concentration for the n− regions 243, 345 is $5.0\times10^{17}/cm^3$. All doping concentrations and ranges could be higher or lower. As noted above, the lightly doped regions 243, 245 may be intentionally or unintentionally doped. In some embodiments, there may be some diffusion of the impurities during device fabrication. For example, the aforementioned doping concentrations may, in some embodiments, be peak doping concentrations. Therefore, it will be understood that the doping is not necessarily uniform in a given region. Further details and examples are discussed below.

Figure 1C:
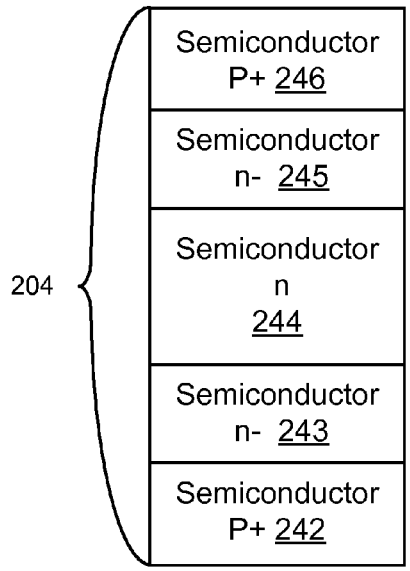

FIGS. 1A and 1B depict diodes 204 with the emitter/collector being N+ or a combination of N+ and n− and the base being p or a combination of p and p−. In some embodiments, the emitter/collectors are P+ (or a combination of P+ and p−) and the base is n (or a combination of n and n−). FIG. 1C depicts one embodiment in which the diode 204 has two P+ regions 242, 246, two n− regions 243, 245, and an n region 244. The semiconductor could be silicon, as one example. An example doping concentration for the P+ regions 242, 246 is $1.0\times10^{21}/cm^3$. An example range of doping concentrations for the n region 244 is between $1.0\times10^{18}/cm^3$ and $8.0\times10^{18}/cm^3$. An example doping concentration for the n− regions 243, 345 is $5.0\times10^{17}/cm^3$. All doping concentrations and ranges could be higher or lower. As noted above, the lightly doped regions 243, 245 may be intentionally or unintentionally doped.

Figure 1D:
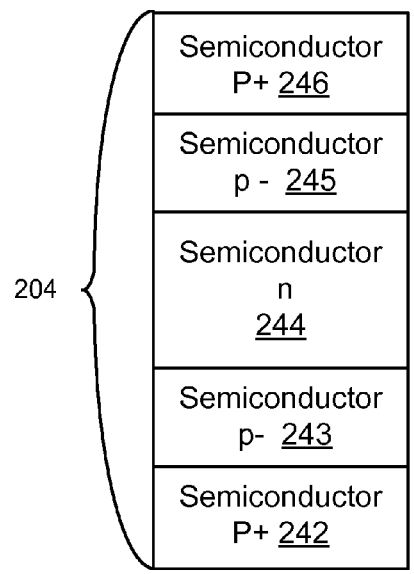

FIG. 1D depicts one embodiment in which the diode 204 has two P+ regions 242, 246, two p− regions 243, 245, and an n region 244. The semiconductor could be silicon, as one example. An example doping concentration for the P+ regions 242, 246 is $1.0\times10^{21}/cm^3$. An example range of doping concentrations for the n region 244 is between $1.0\times10^{18}/cm^3$ and $8.0\times10^{18}/cm^3$. An example doping concentration for the p− regions 243, 345 is $5.0\times10^{17}/cm^3$. All doping concentrations and ranges could be higher or lower. As noted above, the lightly doped regions 243, 245 may be intentionally or unintentionally doped.

Figure 2A:
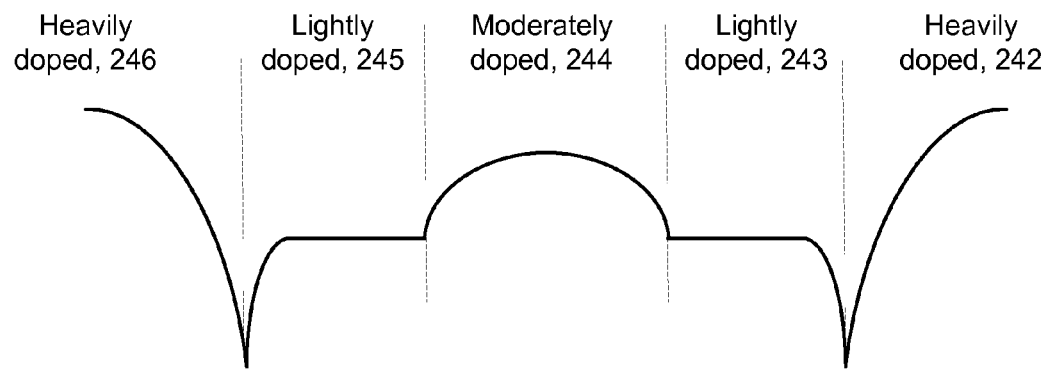

FIGS. 2A-2G depict various net doping profiles for embodiments of punch-through diodes 204. Dashed lines are used to represent the approximate locations of the different regions 242-246. As mentioned above, there may be some diffusion of impurities after the impurities are first added. Thus, for some regions the doping concentrations may vary. In the embodiment of FIG. 2A, the diode 204 may be an N+/p−/p/p−/N+ device such as the diode 204 of FIG. 1A. The diode 204 may be instead be a P+/n−/n/n−/P+ device such as the diode 204 of FIG. 1C. The diode 204 has first and second p-n junctions, which may be at the junction between the heavily doped regions 242, 246 and lightly doped regions. 243, 245. The doping concentration in the moderately doped region 244 may be higher than that of the lightly doped regions 243, 245. Moreover, the doping profile in the moderately region 244 may have a peak in the middle. However, the peak in the middle of the moderately region 244 is not required. For example, if diffusion can be prevented then the moderately doped region 244 may have a more uniform net doping profile. However, the moderately region 244 should have a higher peak doping concentration than the lightly doped regions 243, 245, in this embodiment.

In the diode 204 of FIG. 2A, the net doping concentration in the moderately doped region 244 may be adjusted to control the onset of punch-through conduction. For example, increasing the net doping concentration may delay the onset of punch-through conduction (e.g., punch-through conduction may occur at a voltage of greater magnitude). On the other hand, decreasing the net doping concentration may hasten the onset of punch-through conduction (e.g., punch-through conduction may occur at a voltage of lower magnitude).

The doping profile of the diode 204 of FIG. 2A may result in a low off current (Ioff). Note that when the diode 204 is used in some memory arrays, the memory cell 200 might have a voltage of Vselect when a memory cell 200 is selected and some fraction of Vselect, such as Vselect/2 when the memory cell 200 is not selected. The situation in which the fraction of Vselect is applied may be associated with a case in which a memory cell is not selected. In such a case, a low diode current may be desired. The diode current when Vselect is applied may be referred to as Ion, whereas the diode current when the fraction of Vselect is applied may be referred to as Ioff. The fraction of Vselect that is used may depend on the array-biasing scheme. Further details are discussed below. In the embodiment of FIG. 1A, the net doping concentration in the lightly doped regions 243, 245 is substantially uniform for much of the lightly doped regions 243, 245. However, this is not a requirement.

During operation of the diode 204, one of the p-n junctions may be reverse biased. The doping profile of the embodiment of FIG. 2A may result in a low "leakage" current of the reverse biased junction. Another way to view this is that the doping profile may be calculated to control (e.g., reduce) the leakage current of the reverse biased junction. One way to view the doping profile is that it may reduce the peak electric field at the p-n junctions. A reason why the doping profile may reduce the peak electric field is that the doping gradient at the p-n junctions may be low. In general, the electric field distribution at a p-n junction may be dependent on the doping profile at the p-n junction. In the case of the diode of FIG. 2A, having lightly doped regions 243, 245 at the p-n junctions may result in a low doping gradient, which may help to reduce the peak electric field at the p-n junction. One factor in Ioff may be band-to-band (BTB) tunneling. The doping profile of the diode 204 of FIG. 2A may reduce band-to-band BTB tunneling. For example, the doping profile of the lightly doped regions 243, 245 may help to reduce BTB tunneling, and hence, to reduce Ioff.

Figure 2B:
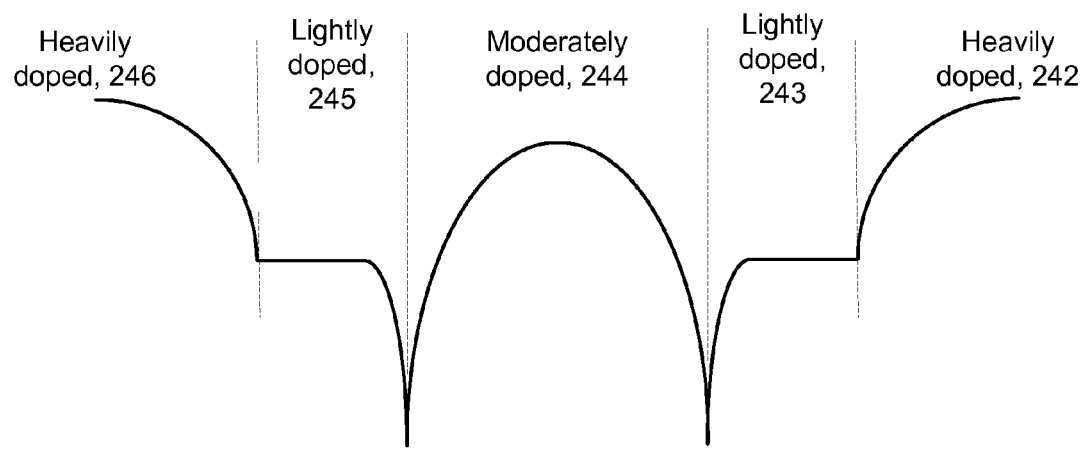

FIG. 2B depicts a net doping profile for one embodiment of a punch-through diode 204. In this embodiment, the diode 204 may be an N+/n−/p/n−/N+ device similar to the diode 204 in FIG. 1B. The diode 204 may instead be a P+/p−/n/p−/P+ device similar to the diode 204 in FIG. 1D. The diode 204 of FIG. 2B has first and second p-n junctions, which may be at the junctions between the moderately doped 244 and the lightly doped regions 243, 245. The peak of the net doping concentration in the moderately doped region 244 may be higher than that of the lightly doped regions 243, 245. Moreover, the doping profile in the moderately doped region 244 may have a peak in the middle. However, the peak in the middle of the moderately doped region 244 is not required. For example, if diffusion can be prevented or minimized (e.g. in the case of low thermal budget of annealing steps), then the moderately doped region 244 may have a more uniform net doping profile. However, the moderately doped region should have a higher peak concentration than the lightly doped regions 243, 245.

In the diode 204 of FIG. 2B, the doping profile may be optimized by the means of process and device simulation or actual experiments to control the onset of punch-through conduction. For example, the net doping concentration in the moderately doped region 244 may be optimized to control the onset of punch-through conduction. In the diode 204 of FIG. 2B, the doping profile may also be optimized to reduce Ioff. For example, the doping profile may be optimized (or calculated) to reduce the peak electric field near the p-n junctions. As one example, the lightly doped regions 243, 245 may help to reduce the doping gradient, which may reduce the peak electric field near the p-n junctions. The doping in lightly doped regions 243, 245 may be calculated to reduce BTB tunneling. In this embodiment, the net doping concentration is substantially uniform for much of the lightly doped regions 243, 245. However, this is not a requirement.

FIG. 2C depicts several net doping profiles of an embodiment of a punch-through diode 204. In this embodiment, the diode 204 may be an N+/p−/p/p−/N+ device. The diode 204 could also be a P+/n−/n/n−/P+ device. In FIG. 2C, three different net doping profiles are depicted in the base region, which in this case includes the moderately doped region 244 and the two lightly doped regions 243, 245. The doping concentration in the moderately doped region 244 in each case is different. As possible examples, the peak 237 of one doping concentration could be $1.0 \times 10^{18}/cm^3$, the peak 235 of another could be $2.0 \times 10^{18}/cm^3$, and the peak 233 of another could be $5.0 \times 10^{18}/cm^3$. As noted above, by increasing the net doping concentration in the moderately doped region 244, the onset of punch-through conduction may be delayed.

The peak of the doping concentration in the lightly doped regions 243, 245 might be $5.0 \times 10^{17}/cm^3$ for some cases. It will be understood that the level of doping in the lightly doped regions may be higher or lower. For example, in some embodiments the level of doping in the lightly doped regions can be $2-5 \times 10^{16}/cm^3$—the level of background doping concentration for the case of no intentional doping, Note that near each p-n junction the net doping concentration is relatively low, which may reduce the peak electric field. This may also reduce BTB tunneling. Note that the thickness of the lightly doped regions 243, 245, as well as their doping concentrations may be selected to reduce the peak electric field near the p-n junctions. This may help to reduce BTB tunneling, as well as leakage (or Ioff) current.

Note that the thickness of the moderately doped region 244 may be calculated for desired performance. FIG. 2D depicts net doping profiles of embodiments of a punch-through diode 204. In these embodiments, the diode 204 may be an N+/p−/p/p−/N+ device. The diode 204 could also be a P+/n−/n/n−/P+ device. In FIG. 2D, two different doping profiles are depicted in the moderately doped region 244. The peak doping concentration in the moderately doped region 244 may be about the same for each case. However, the thickness of the moderately doped region 244 may be different for the two cases. For example, the thickness of the moderately doped region 244a in one diode may be 5 nanometers (nm), whereas the thickness of the moderately doped region 244b in the other diode may be 10 nm. Other thicknesses could be used. In some embodiments, by decreasing the thickness of the base, with the same net doping concentration in the base, the onset of punch-through conduction may be moved to lower voltages, with an increase in Ion current and some increase in Ioff current at respectively Vselect and Vunselect biases (example biasing schemes are discussed below). The thickness of the base region and the doping level and doping profile in the base can be optimized for each particular case to achieve the best device performance (e.g. for increase in Ion/Ioff ratio).

The peak doping concentration in the lightly doped regions 243, 245 might be $5.0 \times 10^{17}/cm^3$ for some cases in the embodiment of FIG. 2D. It will be understood that the level of doping in the lightly doped regions maybe also higher or lower. For example, in some embodiments the level of doping in the lightly doped regions can be $2-5 \times 10^{16}/cm^3$ corresponding to the level of background doping concentration for the case of no intentional doping. Note that the doping profile in the lightly doped regions 243, 245 may help to reduce the peak electric field at the p-n junctions and may reduce leakage current (e.g., BTB tunneling and possibly other effects may be reduced).

Figure 2E:
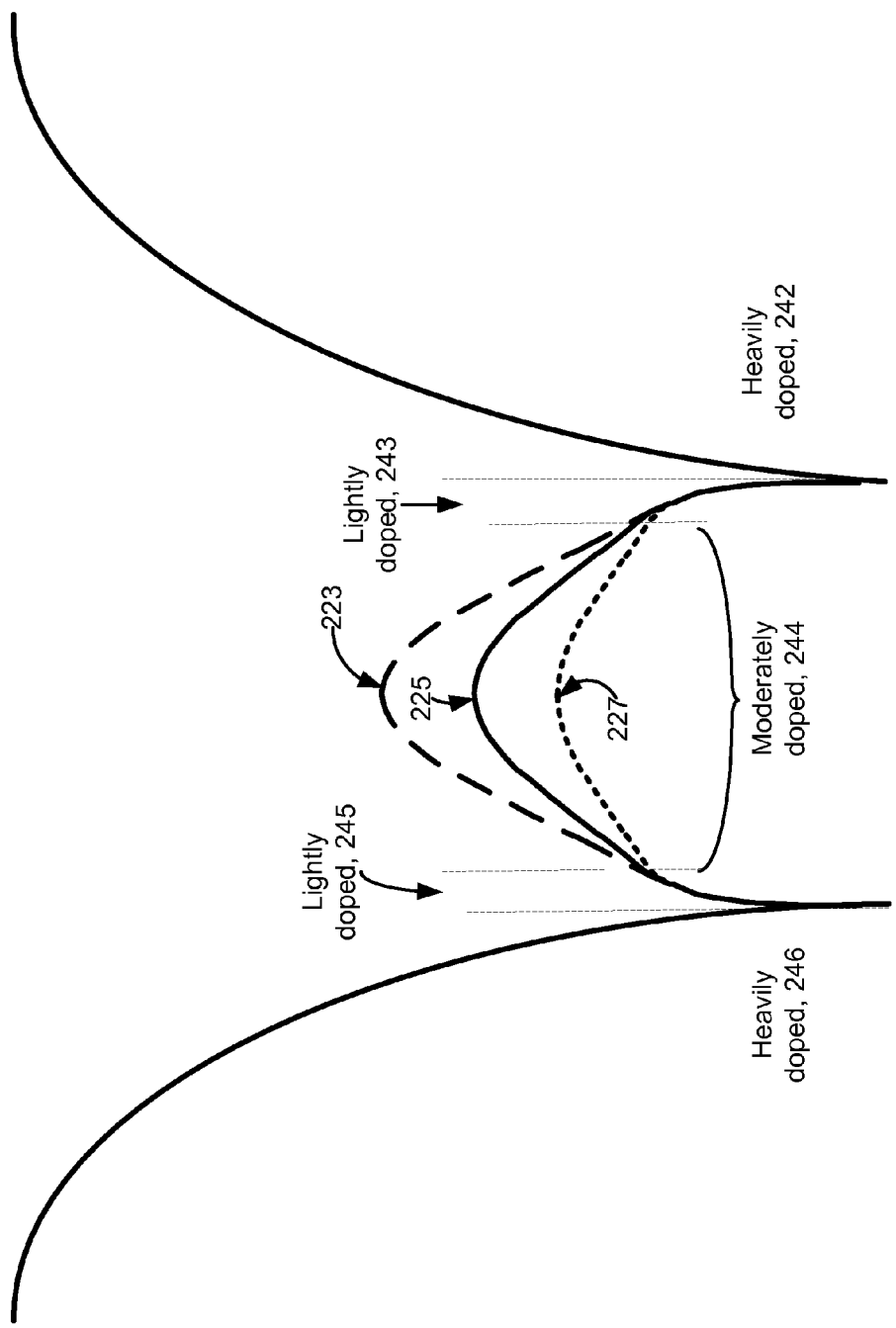

FIG. 2E depicts net doping profiles of one embodiment of a punch-through diode 204. In this embodiment, the diode 204 may be an N+/p−/p/p−/N+ device. The diode could also be a P+/n−/n/n−/P+ device. In FIG. 2E, three different doping profiles are depicted in the moderately doped region 244. The peak doping concentration in the moderately doped region 244 in each case is different. As possible examples, one peak doping concentration 227 could be $3.0 \times 10^{18}/cm^3$, another peak doping concentration 225 could be $5.0 \times 10^{18}/cm^3$, and another peak doping concentration 223 could be $8.0 \times 10^{18}/cm^3$. The peak doping concentration in the lightly doped regions 243, 245 might be $5.0 \times 10^{17}/cm^3$ for all cases.

In the embodiment of FIG. 2E, there may not be a distinct flat region in the lightly doped regions 243, 245, as was the case in the embodiment depicted in FIG. 2A. However, near each p-n junction (e.g., in the lightly doped regions 243, 245), the net doping concentration may be relatively low, which may result in a relatively low peak electric field and may help to reduce BTB tunneling and leakage current. Note that the thickness of the lightly doped regions 243, 245, as well as their doping concentrations (or profiles) may be calculated to reduce the peak electric field and to reduce BTB tunneling.

In some embodiments, the doping concentration in the heavily doped regions 242, 246 is graded. In some embodiments with a graded doping profile, the doping concentration in the heavily-doped regions 242 246 is lowest near the lightly-doped regions 243, 245. For example, the doping concentration in the heavily-doped regions 242, 246 near the interface with the lightly-doped regions 243, 245 may be about $1.0 \times 10^{18}/cm^3$ gradually increasing to about $1.0 \times 10^{21}/cm^3$ in a direction away from the lightly-doped region 244. In one embodiment, the doping concentration in the heavily-doped regions 242, 246 is graded, but the doping concentration in the lightly-doped regions 243, 245 is substantially uniform. However, the doping concentration in the lightly-doped regions 243, 245 may be graded.

FIG. 2F depicts net doping profiles of embodiments of a punch-through diode 204. In these embodiments, the diode 204 may be an N+/n−/p/n−/N+ device. The diode 204 could also be a P+/p−/n/p−/P+ device. The doping profile may be somewhat similar to the example of FIG. 2B. However, in this embodiment, the lightly doped regions 243, 245 do not have a uniform doping concentration.

The doping concentration in the moderately doped region 244 may be calculated to control the onset of punch-through conduction. As possible examples, one peak doping concentration could be anywhere from $3.0 \times 10^{18}/cm^3$ to $9.0 \times 10^{18}/cm^3$. The peak doping concentration in the lightly doped regions 243, 245 might be $5.0 \times 10^{17}/cm^3$.

In the example of FIG. 2F, the lightly doped regions 243, 245 may be on the emitter/collector side of the p-n junctions. The lightly doped regions 243, 245 have a relatively low peak doping concentration, which may reduce the peak electric field at the p-n junction and may reduce BTB tunneling. The thickness of the lightly doped regions 243, 245, as well as their doping concentrations may be calculated to reduce the peak electric field, as well as to reduce BTB tunneling.

Figure 2G:
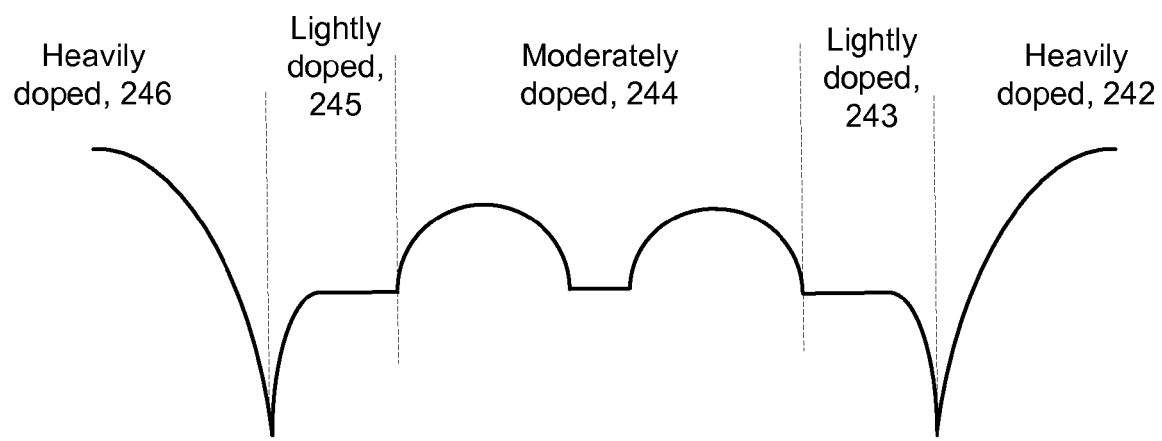

Note that in the doping profiles of FIG. 2A-2F there is a single peak in the moderately doped region 244. However, there may be more than one peak in the moderately doped region 244. FIG. 2G depicts a doping profile for one embodiment of a punch-through diode 204 in which the moderately doped region 244 has two peaks. Another way of viewing the embodiment of FIG. 2G is that there are two moderately doped regions 244, which may be separated by a lightly doped region.

Also note that it is not required that the net doping profile in a given region be monotonically increasing or decreasing. For example, the doping profile in lightly doped regions 243, 245 may have one or more local peaks.

FIGS. 2A-2G are examples in which the first semiconductor region 242 has a first conductivity type and a first peak doping concentration, the second semiconductor region has a second peak doping concentration that is less than the first peak doping concentration, the third semiconductor region 244 has a third peak doping concentration that is greater than the second peak doping concentration, the fourth semiconductor region 245 has a fourth peak doping concentration that is less than the third peak doping concentration, and the fifth semiconductor region has a fifth peak doping concentration that is greater than the third peak doping concentration. It may be that the peak doping concentration of the first semiconductor region 242 and the fifth semiconductor region 246 are about the same, but this is not required. It may be that the peak doping concentration of the second semiconductor region 243 and the fourth semiconductor region 245 are about the same, but this is not required.

Figure 3:
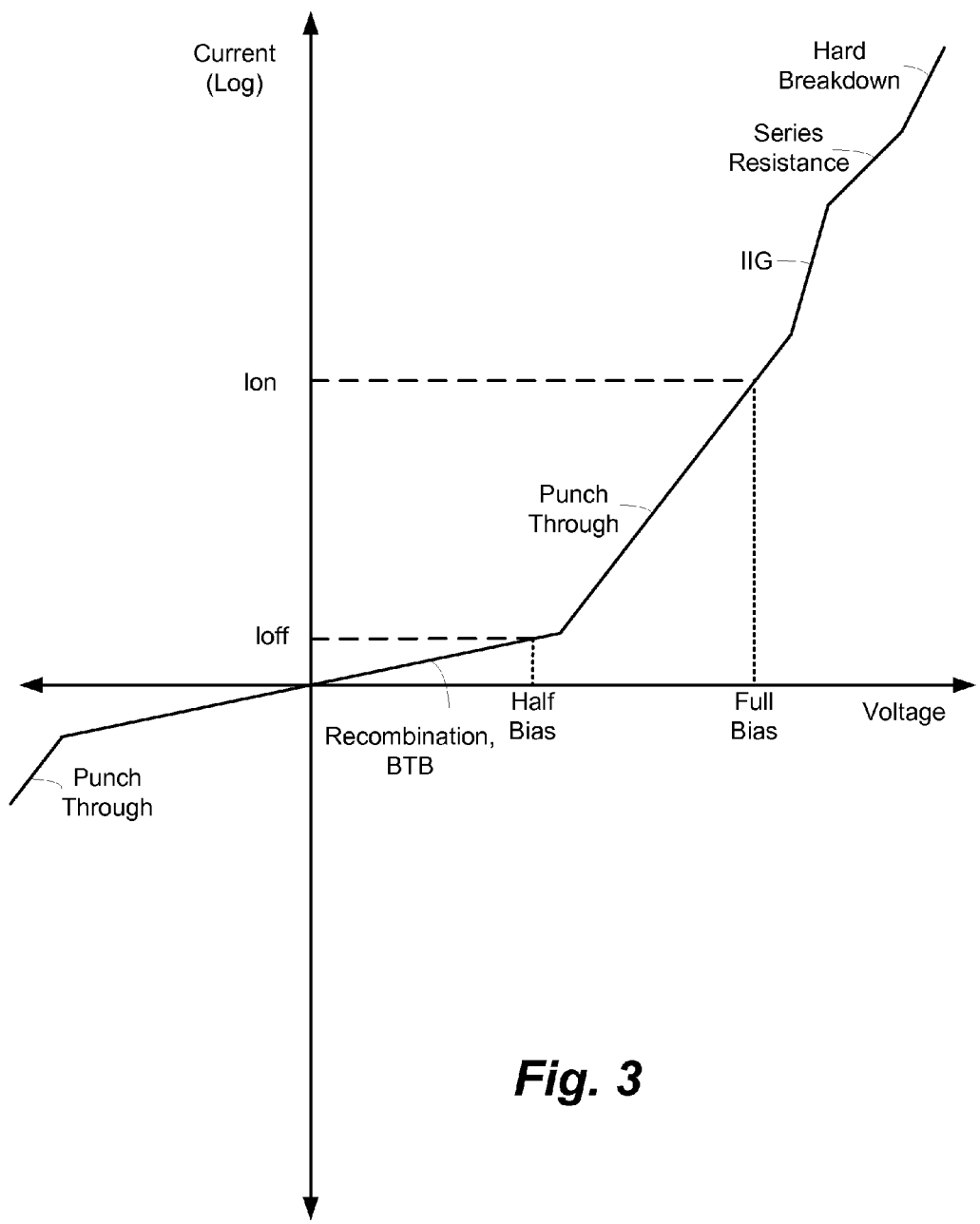
FIG. 3 is a graph showing a current-voltage relationship of one embodiment of a punch-through diode.

FIG. 3 depicts a graph of current-voltage (I-V) relationship of one embodiment of a punch-through diode 204. Note that the I-V curve may be symmetric about the origin. However, for purposes of discussion the I-V curve in the first quadrant will be discussed. The current may be considered to arise due to various factors, such as BTB tunneling, punch-through conduction, etc. The I-V curve is labeled to show where a given effect may be significant or predominant. For example, at low voltages, recombination-generation and BTB tunneling may be predominant. After the voltage reaches a certain level, punch-through conduction begins. Therefore, the slope of the I-V curve may increase substantially at this point. At higher voltage levels, multiplication due to impact-ionization/generation (IIG) may begin. At this point, the slope of the I-V curve may increase even further. For some applications, IIG may be undesirable. For example, current levels may be difficult to control and/or there may be reliability concerns due to hot carrier generation. At still higher voltage levels, the current may be characterized by series resistance and hard breakdown.

Figure 4B:
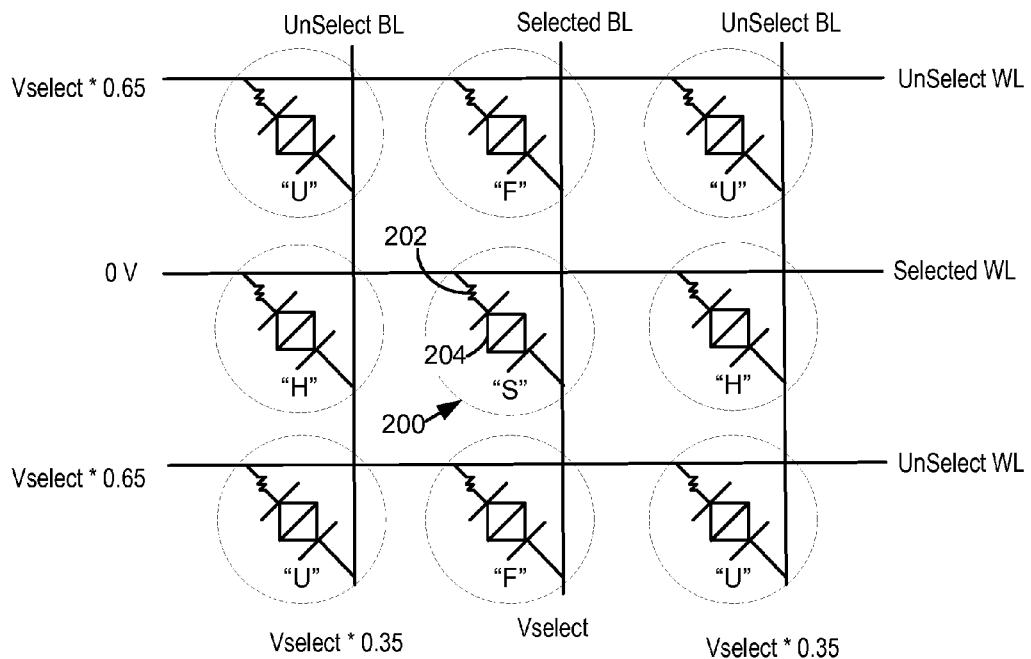
FIG. 4B depicts one embodiment of an array-biasing scheme for programming memory cells.
Figure 4A:
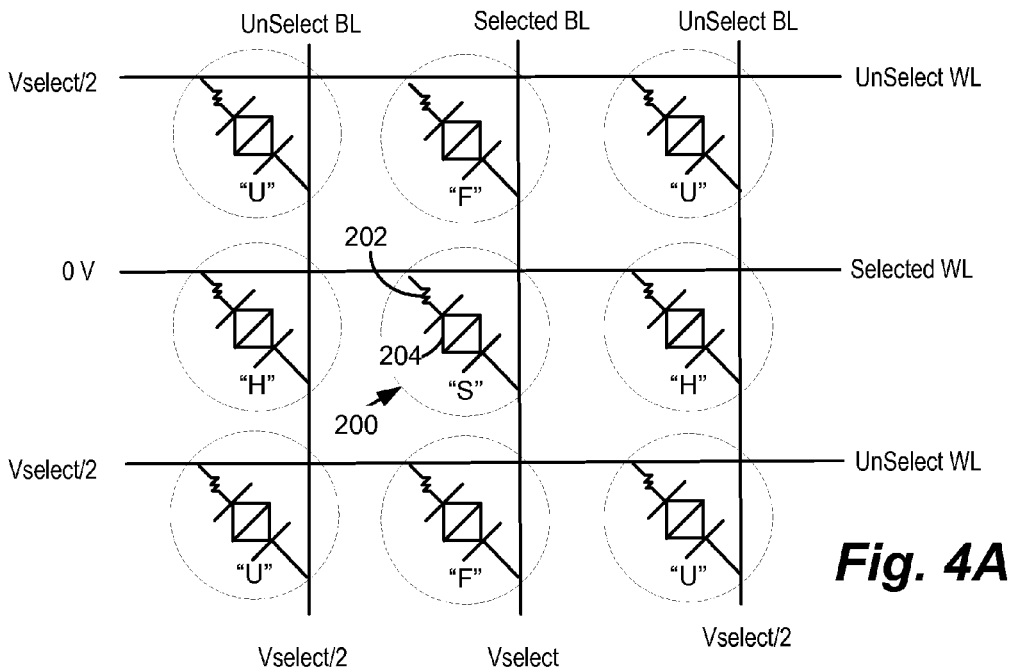
FIG. 4A depicts one embodiment of an array-biasing scheme for programming memory cells.

For some applications, the diode 204 may be operated at two significant voltage levels. For example, if the diode 204 is used as a steering element in a memory array, it may be operated at a full-bias level and a half-bias level. Instead of half-bias, some other fraction of full-bias might be used, such as one-third bias. FIGS. 4A and 4B depict two example array biasing schemes. In FIG. 4A, some memory cells that are operated at half-bias are intended to be off. In this biasing scheme, Vselect is applied to the selected bit line (BL) while the selected word line (WL) is grounded, resulting in about Vselect across the selected memory cell (identified as "S" in FIG. 4A). Note that there may be some voltage drop across the selected bit line and the selected word line; however, to simplify the discussion these effects will be ignored. Unselected word lines each have Vselect/2 applied thereto. This results in about Vselect/2 across unselected memory cells that are along the selected bit line (identified as "F" in FIG. 4A). Unselected bit lines each have Vselect/2 applied thereto. This results in about Vselect/2 across unselected memory cells that are along the selected word line (identified as "H" in FIG. 4A). The foregoing applied voltages cause about 0V to be across unselected memory cells that are along both an unselected bit line and an unselected word line (identified as "U" in FIG. 4A).

Referring again to the example I-V curve in FIG. 3, it may be seen that with Vselect across the selected memory cell, the punch-through diode 204 will be conducting the current Ion. However, for the unselected memory cells that are marked as "F" or "H" in FIG. 4A, their punch-through diodes 204 conduct a current Ioff, as a result of Vselect/2 being applied. Note that during programming, there may be many "U" memory cells, and also many "F" memory cells. Thus, power consumed by such "off" memory cells may be substantial.

Note that the voltage across an "off" memory cell could be a fraction of Vselect other than Vselect/2. FIG. 4B depicts one embodiment of an array biasing scheme in which Vselect is applied to the selected bit line (BL) while the selected word line (WL) is grounded, resulting in about Vselect across the selected memory cell (identified as "S" in FIG. 4B). At the same time, unselected word lines each have 0.65*Vselect applied thereto. This results in about 0.35*Vselect across unselected memory cells that are along the selected bit line (identified as "F" in FIG. 4B). At the same time, unselected bit lines each have 0.35*Vselect applied thereto. This results in about 0.35*Vselect across unselected memory cells that are along the selected word line (identified as "H" in FIG. 4B). The foregoing applied voltages cause about 0.3*Vselect to be across unselected memory cells that are along both an unselected bit line and an unselected word line (identified as "U" in FIG. 4B).

Referring again to the example I-V curve of FIG. 3, a selected memory cell may still have about Vselect applied thereto. However, unselected memory cells might have about 0.3*Vselect to about 0.35*Vselect applied thereto. Thus, the value for Ioff could be lower in this case. However, it may still be desirable to have a low Ioff. Also note that in the biasing scheme of FIG. 4B, none of the depicted memory cells have 0V across them (in contrast with the biasing scheme of FIG. 4A). Therefore, there may be more "off" memory cells that consume at least some power.

Table 1 summarizes some example biasing schemes for programming memory cells. In Table 1, the biasing is described relative to the voltage across the selected cell. Note that the sum of the voltages across the "F," "H," and "U"

memory cells equals 100%, in these examples. The first row roughly summarizes the embodiment of FIG. 4B, and the second row roughly summarizes the embodiment of FIG. 4A. The third row and fourth rows describe yet other embodiments.

TABLE 1

| Selected cell | "F" cell | "U" cell | "H" cell |
|---|---|---|---|
| 100% | 35% | 30% | 35% |
| 100% | 50% | 0% | 50% |
| 100% | 40% | 10% | 50% |
| 100% | 32% | 32% | 36% |

Note that a wide variety of biasing schemes are possible by varying the percentage of bias that is applied across the "F," "H," and "U" memory cells. Also referring back to the examples of FIGS. 4A and 4B, the voltage applied to the selected bit line could be greater or less than shown.

Embodiments disclosed herein may improve the ratio of Ion/Ioff. This may reduce power consumption for reasons that should be apparent from the previous discussion. Returning again to the discussion of FIG. 3, an example is shown in which the punch-through diode 204 might be operated at a "full bias" level such that the diode 204 operates in punch-through conduction. As noted, it may be desirable to avoid operating at a higher voltage level, which could initiate significant IIG. At "half-bias" the diode 204 is considered to be at an Ioff current. In this example, punch-through conduction has not yet initiated when the diode 204 is biased at Ioff.

Note that if the full bias voltage were to be increased, this may lead to operation in IIG. Also note for a given biasing scheme, if the full bias voltage were to be increased, then the half bias voltage also may be increased, which may lead to operation in punch-through conduction. Therefore, considerable current might be consumed by "off" memory cells. In some cases, the Ion/Ioff ratio might be improved by doping the diode 204 in a way that causes punch-through conduction to occur at a higher voltage magnitude. For example, it may be desirable to avoid punch-through conduction when the diode is operated at Vselect/2 (or some other fraction). However, causing punch-through conduction to begin at too high of a voltage magnitude may not be desirable, as this may reduce Ion. For some embodiments, the doping level is calculated based on expected use of the punch-through diode 204. For example, an array-biasing scheme may be factored into the decision as to how to dope the diode 204.

As noted, embodiments disclosed herein include diodes 204 with low leakage current. One reason for this is reducing BTB tunneling; however, other factors may help to reduce the leakage current. By reducing leakage current, Ioff may be reduced significantly. Therefore, the ratio Ion/Ioff may be improved.

Figure 5:
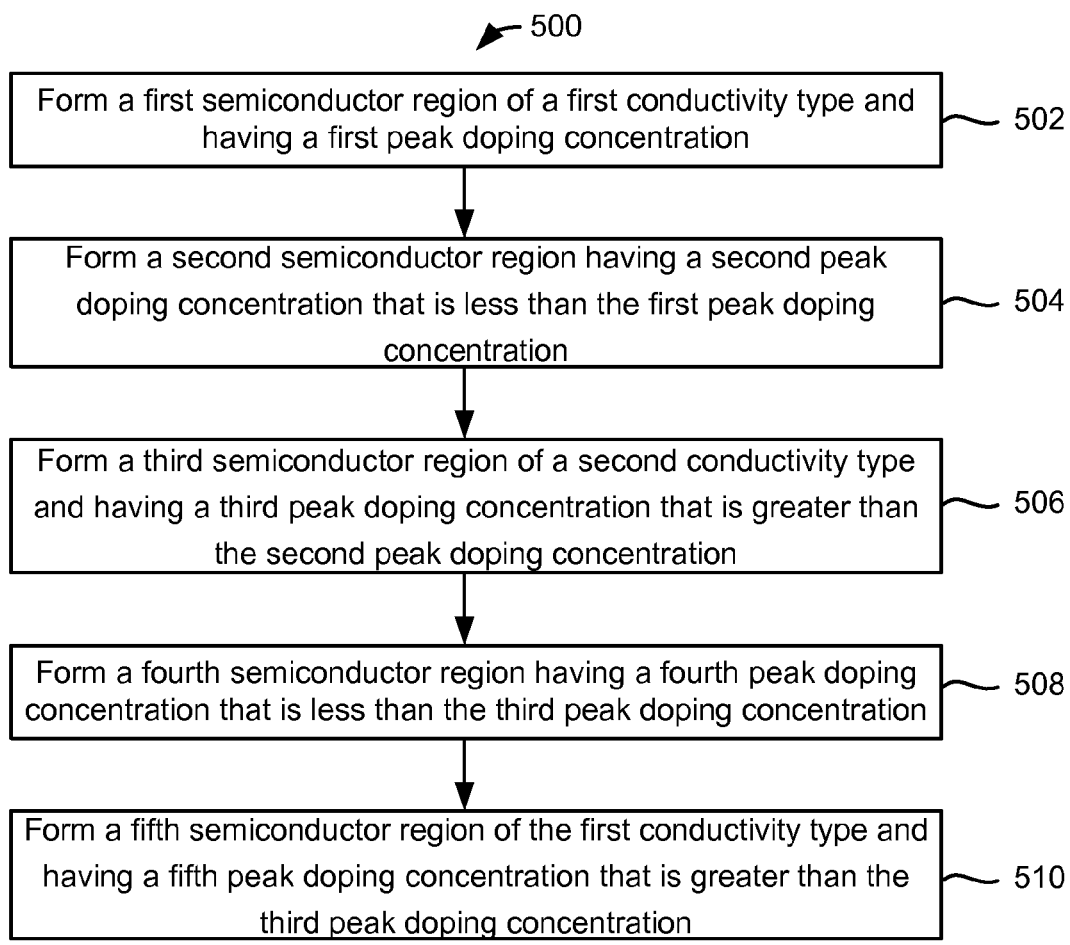
FIG. 5 is a flowchart of one embodiment of a process of fabricating a punch-through diode.

FIG. 5 is a flowchart of one embodiment of a process 500 of fabricating a punch-through diode 204. The process 500 may be used to fabricate a diode 204 such as the embodiments of FIGS. 1-1D. The diode 204 could have various doping profiles, including but not limited to, the doping profiles of FIGS. 2A-2G. In process 500, a "first conductivity type" and a "second conductivity type" are discussed. The first and second conductivities are opposite each other—either could be positive or negative. Example p-type dopants include, but are not limited to, boron, boron-fluoride, and indium. Example n-type dopants include, but are not limited to, phosphorous, arsenic, and antimony.

In step 502, a first semiconductor region of a first conductivity type and having a first peak doping concentration is formed. For example, a heavily doped region 242 may be formed. In some embodiments, a first emitter/collector that is heavily-doped with an impurity having a first conductivity is formed in step 502.

In step 504, a second semiconductor region adjacent to the first semiconductor region and having a second peak doping concentration that is less than the first peak doping concentration is formed. For example, a lightly doped region 234 may be formed. The second semiconductor region may be the first conductivity type or a second conductivity type (opposite the first conductivity type). For example, for the diodes 204 of FIGS. 1A and 1C, the second semiconductor region 243 has a second conductivity type. On the other hand, for the diodes 204 of FIGS. 1B and 1D, the second semiconductor region 243 has the first conductivity type. Note that the second semiconductor region may be intentionally or un-intentionally doped.

In step 506, a third semiconductor region of the second conductivity type adjacent to the second semiconductor region and having a third peak doping concentration that is greater than the second peak doping concentration is formed. For example, a moderately doped region 244 may be formed.

In step 508, a fourth semiconductor region adjacent to the third semiconductor region and having a fourth peak doping concentration that is less than the third peak doping concentration is formed. For example, a lightly doped region 245 may be formed. The fourth semiconductor region may be of either the first conductivity type or the second conductivity type. For example, for the diodes 204 of FIGS. 1A and 1C, the fourth semiconductor region 245 has the second conductivity type. On the other hand, for the diodes 204 of FIGS. 1B and 1D, the fourth semiconductor region 245 has the first conductivity type. Note that the fourth semiconductor region may be intentionally or un-intentionally doped).

In step 510, a fifth semiconductor region of the first conductivity type adjacent to the fourth semiconductor region and having a fifth peak doping concentration that is greater than the peak third doping concentration is formed. For example, a heavily doped region 246 may be formed. In some embodiments, a second emitter/collector including a semiconductor material that is heavily-doped with an impurity having the first conductivity is formed in step 510. In some embodiments, a base having a first p-n junction with the first emitter/collector and a second p-n junction with the second emitter/collector is formed in steps 204-508.

Figure 6A:
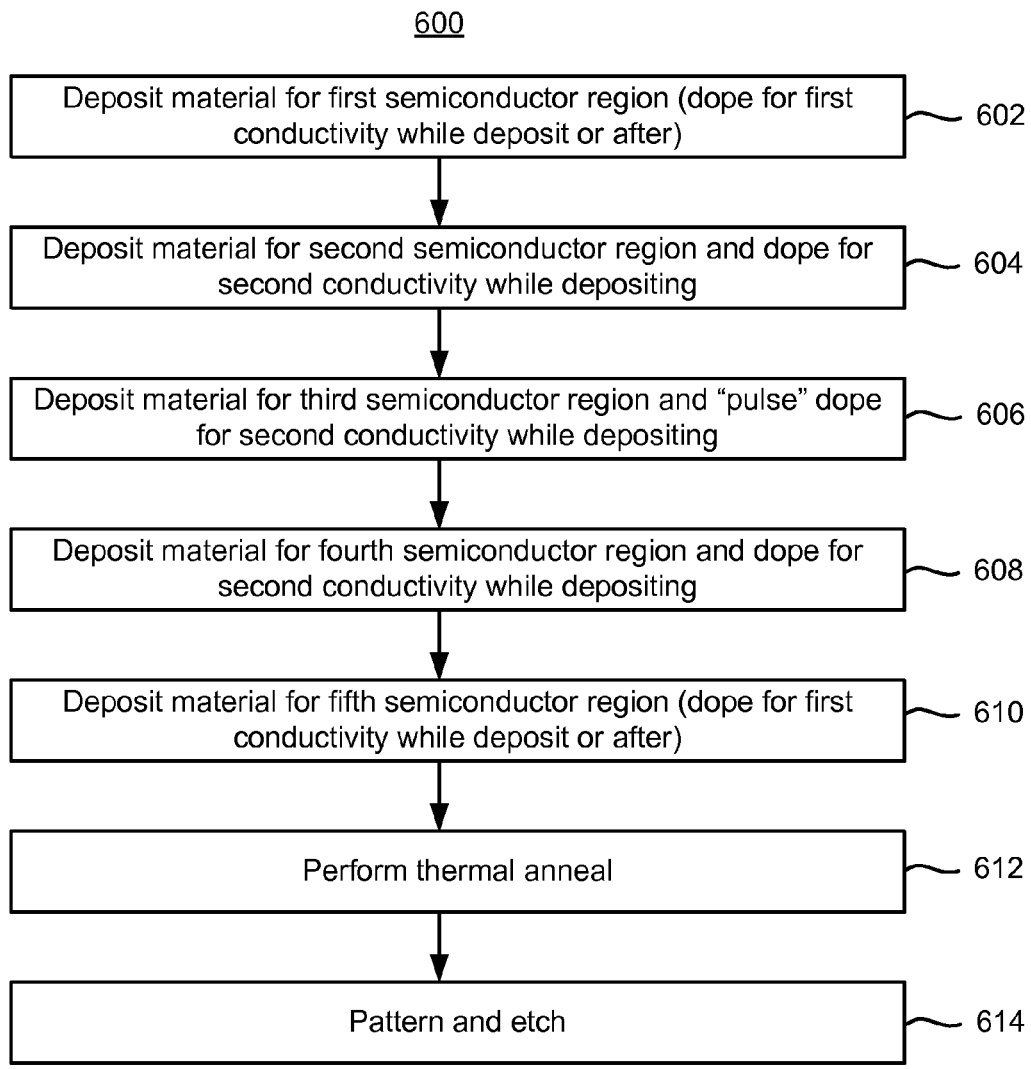
FIG. 6A is a flowchart of one embodiment of a process of fabricating and doping punch-through diodes.

FIG. 6A is a flowchart of one embodiment of a process 600 of forming a punch-through diode 204. Process 600 discusses ways in which doping may be performed. Process 600 may be used to fabricate a diode 204 such as the embodiments of FIGS. 1, 1A, and 1C. The diode 204 could have various doping profiles, including but not limited to, the doping profiles of FIG. 2A, 2C, 2D, or 2E. In general, process 600 provides more details for an embodiment of process 500 in which the lightly doped regions 243, 245 have the same conductivity as the moderately doped region 244.

In step 602, material is deposited for a first semiconductor region 242. For example, a layer of silicon or another semiconductor is deposited. The first semiconductor region 242 may be doped for a first conductivity while depositing the semiconductor or afterwards. An example doping concentration for the first semiconductor region 242 is $1.0 \times 10^{21}/cm^3$. Initially, the doping concentration could be uniform, although this is not required. Later process steps may cause the doping profile to take on a shape such as depicted in FIG. 2A, 2C, 2D, or 2E, for example.

In step 604, material is deposited for a second semiconductor region 243. For example, a layer of silicon or another semiconductor is deposited. In this embodiment, the second semiconductor region 243 may be doped for a second conductivity while depositing the semiconductor. An example doping concentration for this lightly doped region is 243 is $5.0 \times 10^{17}/cm^3$. Initially, the doping concentration could be uniform, although this is not required. Later process steps may cause the doping profile to take on a shape such as depicted in FIG. 2A, 2C, 2D, or 2E, for example.

In step 606, material is deposited for a third semiconductor region 244. For example, a layer of silicon or another semiconductor is deposited. In this embodiment, the third semiconductor region 244 may be doped for the second conductivity while depositing the semiconductor. An example range of doping concentrations for the third semiconductor region 244 is between $1.0 \times 10^{18}/cm^3$ and $8.0 \times 10^{18}/cm^3$. Note that this is an increase from the lightly doped region 243. Herein, this increase may be referred to as "pulsed doping". Initially, the doping concentration could be uniform, although this is not required. Later process steps may cause the doping profile to take on a shape such as depicted in FIG. 2A, 2C, 2D, or 2E, for example.

In step 608, material is deposited for a fourth semiconductor region 245. For example, a layer of silicon or another semiconductor is deposited. In this embodiment, the fourth semiconductor region 245 may be doped for the second conductivity while depositing the semiconductor. An example doping concentration for this lightly doped region is 245 is $5.0 \times 10^{17}/cm^3$. Initially, the doping concentration could be uniform, although this is not required. Later process steps may cause the doping profile to take on a shape such as depicted in FIG. 2A, 2C, 2D, or 2E, for example.

In step 610, material is deposited for a fifth semiconductor region 246. For example, a layer of silicon or another semiconductor is deposited. The fifth semiconductor region 246 may be doped for the first conductivity while depositing the semiconductor or afterwards. An example doping concentration for the fifth semiconductor region 246 is $1.0 \times 10^{21}/cm^3$. Initially, the doping concentration could be uniform, although this is not required. Later process steps may cause the doping profile to take on a shape such as depicted in FIG. 2A, 2C, 2D, or 2E, for example.

In step 612, a thermal anneal may be performed. The thermal anneal could be performed for a variety of reasons, such as to crystallize silicon that was previously deposited to form polycrystalline silicon ("polysilicon"). The thermal anneal may also have the effect of causing the dopants that were added in steps 602-610 to diffuse. This may result in net doping profiles such as those of FIG. 2A, 2C, 2D, or 2E, for example.

In step 614, patterning and etching is performed to form punch-through diodes 204. Therefore, process 600 may be used to form punch-through diodes 204. Note that in some embodiments, additional layers of materials are deposited prior to the pattern and etch such that memory cells 200 such as depicted in FIG. 1 might be formed. For example, the same pattern and etch can be used to form many memory cells 200. Thus, process 600 may form a memory element 200 having a reversible resistivity switching material 230 and may also form a punch-through diode 204 in series with the memory element 204.

Figure 6B:
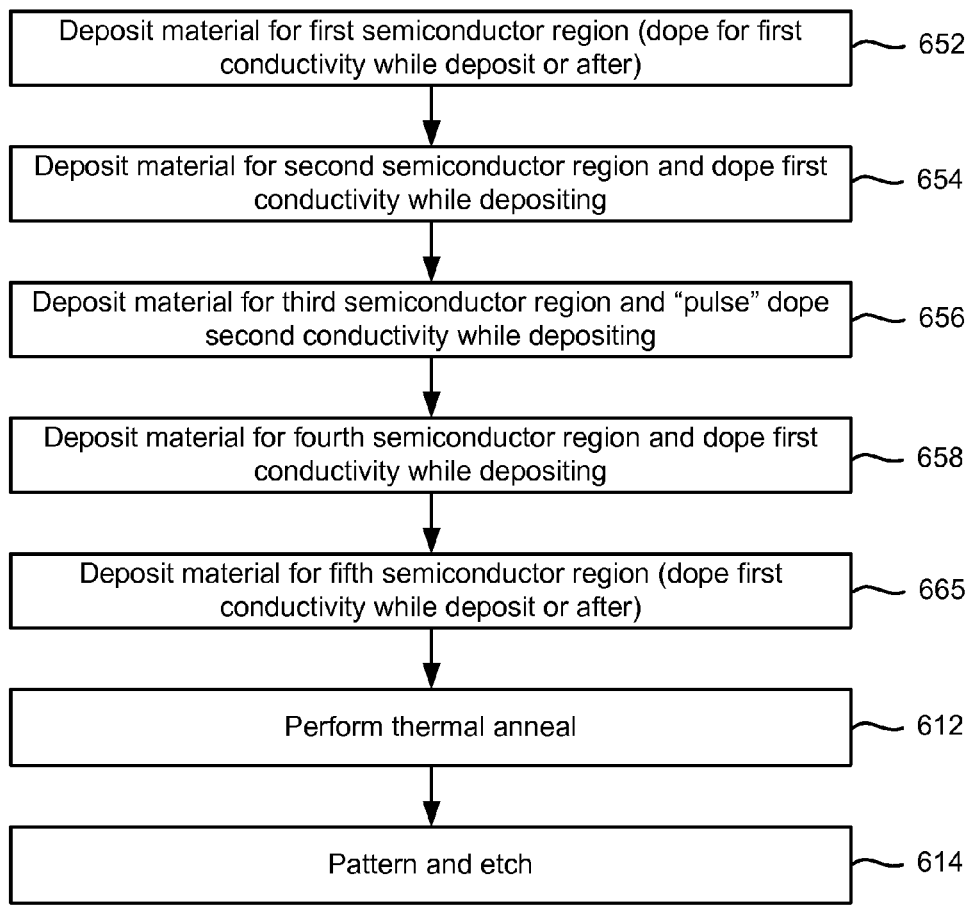
FIG. 6B is a flowchart of one embodiment of a process of fabricating and doping punch-through diodes.

FIG. 6B is a flowchart of one embodiment of a process 650 of forming a punch-through diode 204. Process 650 discusses ways in which doping may be performed. Process 650 may be used to fabricate a diode 204 such as the embodiments of FIGS. 1, 1B, and 1D. The diode 204 could have various doping profiles, including but not limited to, the doping profiles of FIG. 2B or 2F. In general, process 650 provides more details for an embodiment of process 500 in which the lightly doped regions 243, 245 have the same conductivity as the heavily doped regions 242, 246.

In step 652, material is deposited for a first semiconductor region 242. For example, a layer of silicon or another semiconductor is deposited. The first semiconductor region 242 may be doped for a first conductivity while depositing the semiconductor or afterwards. An example doping concentration for the first semiconductor region 242 is $1.0 \times 10^{21}/cm^3$. Initially, the doping concentration could be uniform, although this is not required. Later process steps may cause the doping profile to take on a shape such as depicted in FIG. 2B or 2F, for example.

In step 654, material is deposited for a second semiconductor region 243. For example, a layer of silicon or another semiconductor is deposited. In this embodiment, the second semiconductor region 243 may be doped for the first conductivity while depositing the semiconductor. An example doping concentration for this lightly doped region is 243 is $5.0 \times 10^{17}/cm^3$. Initially, the doping concentration could be uniform, although this is not required. Later process steps may cause the doping profile to take on a shape such as depicted in FIG. 2B or 2F, for example.

In step 656, material is deposited for a third semiconductor region 244. For example, a layer of silicon or another semiconductor is deposited. In this embodiment, the third semiconductor region 244 may be doped for the second conductivity while depositing the semiconductor. An example range of doping concentrations for the third semiconductor region 244 is between $1.0 \times 10^{18}/cm^3$ and $8.0 \times 10^{18}/cm^3$. Note that this is an increase from the lightly doped region 243. Herein, this increase may be referred to as "pulsed doping". Initially, the doping concentration could be uniform, although this is not required. Later process steps may cause the doping profile to take on a shape such as depicted in FIG. 2B or 2F, for example.

In step 658, material is deposited for a fourth semiconductor region 245. For example, a layer of silicon or another semiconductor is deposited. In this embodiment, the fourth semiconductor region 245 may be doped for the first conductivity while depositing the semiconductor. An example doping concentration for this lightly doped region is 245 is $5.0 \times 10^{17}/cm^3$. Initially, the doping concentration could be uniform, although this is not required. Later process steps may cause the doping profile to take on a shape such as depicted in FIG. 2B or 2F, for example.

In step 660, material is deposited for a fifth semiconductor region 246. For example, a layer of silicon or another semiconductor is deposited. The fifth semiconductor region 246 may be doped for the first conductivity while depositing the semiconductor or afterwards. An example doping concentration for the fifth semiconductor region 246 is $1.0 \times 10^{21}/cm^3$. Initially, the doping concentration could be uniform, although this is not required. Later process steps may cause the doping profile to take on a shape such as depicted in FIG. 2B or 2F, for example.

In step 662, a thermal anneal may be performed. The thermal anneal could be performed for a variety of reasons, such as to crystallize silicon that was previously deposited to form polycrystalline silicon ("polysilicon"). The thermal anneal may also have the affect of causing the dopants that were added in steps 652-660 to diffuse. This may result in net doping profiles such as those of FIG. 2B or 2F, for example.

In step 664, patterning and etching is performed to form punch-through diodes 204. Therefore, process 650 may be used to form punch-through diodes 204. Note that in some embodiments, additional layers of materials are deposited prior to the pattern and etch such that memory cells 200 such as depicted in FIG. 1 might be formed. For example, the same pattern and etch can be used to form many memory cells 200.

Figure 7:
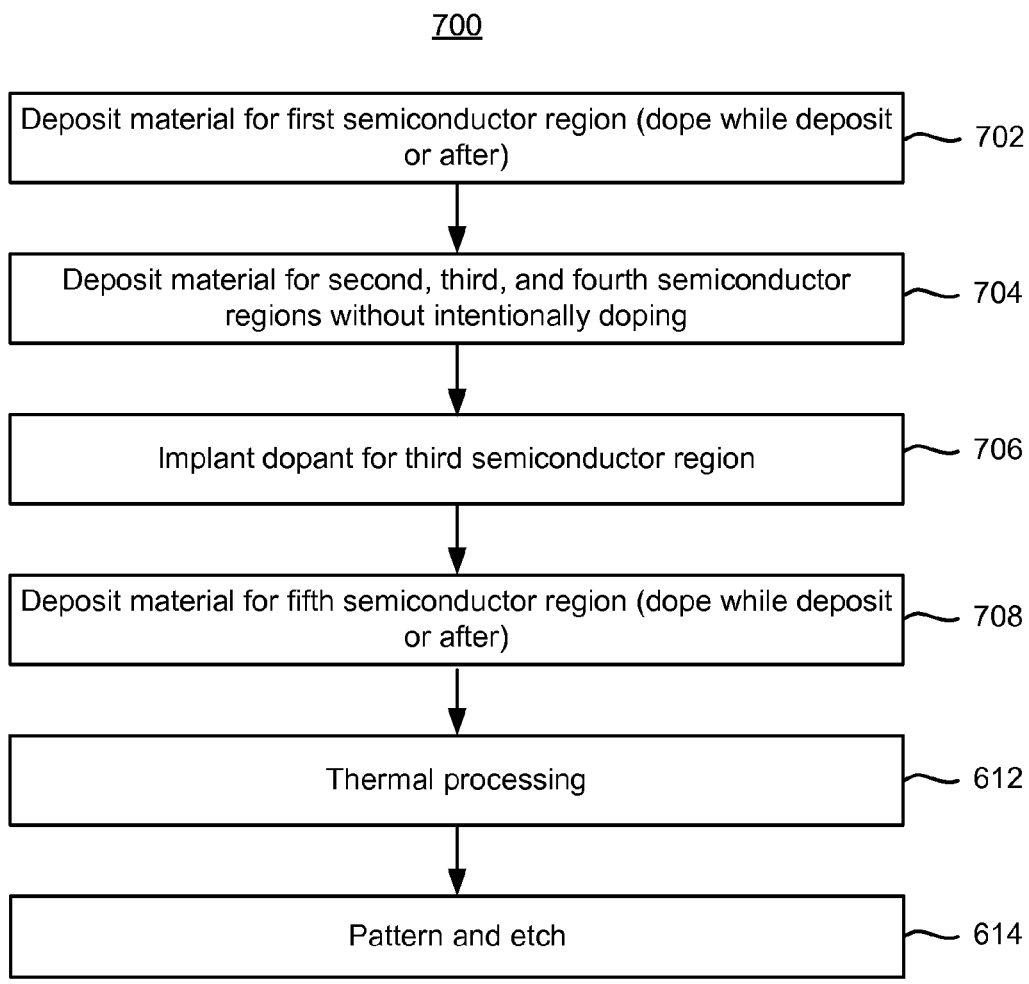
FIG. 7 is a flowchart of one embodiment of a process of fabricating and doping punch-through diodes that includes unintentional doping.

FIG. 7 is a flowchart of one embodiment of a process 700 of forming a punch-through diode 204. Process 700 discusses ways in which doping may be performed. In process 700, the two lightly doped regions 243, 245 are not intentionally doped. However, a light doping level may result anyone. In some embodiments, this may result in a lightly doped n− region. However, a light p-type doping is not precluded. Process 700 may be used to fabricate a diode 204 such as the embodiments of FIGS. 1-1D. For the sake of discussion, examples will be discussed in which the lightly (unintentionally) doped regions behave as a lightly doped n− region. The diode 204 could have various doping profiles, including but not limited to, the doping profiles of FIGS. 2A-2G. For example, for the profile of FIG. 2A, the diode 204 might be P+/n−/n/n−/P+. For the profile of FIG. 2B, the diode 204 might be N+/n−/p/n−/N+. In this context, the n− refers to achieving a light n-type doping profile without intentionally doping.

In step 702, material is deposited for a first semiconductor region 242. For example, a layer of silicon or another semiconductor is deposited. The first semiconductor region 242 may be doped for a first conductivity while depositing the semiconductor or afterwards. An example doping concentration for the first semiconductor region 242 is $1.0 \times 10^{21}/cm^3$. Initially, the doping concentration could be uniform, although this is not required. Later process steps may cause the doping profile to take on a shape such as depicted in FIGS. 2A-2G, for example.

In step 704, material is deposited for a second semiconductor region 243, a third semiconductor region 244, and a fourth semiconductor region 245. For example, a layer of silicon or another semiconductor is deposited. In this embodiment, these semiconductor regions are not intentionally doped during deposition. As noted above, this may result in a light n− doping in some embodiments. One possible reason for the light doping is due to "background" materials that may be present during deposition of the semiconductor. Such background materials are not intentionally introduced during deposition, but may nonetheless result in the addition of an impurity to the semiconductor. Another possible reason for the light doping in this region is due to diffusion of intentionally added dopants from adjacent regions.

In step 706, a dopant is implanted into the third semiconductor region 244. An example range of doping concentrations for the third semiconductor region 244 is between $1.0 \times 10^{18}/cm^3$ and $8.0 \times 10^{18}/cm^3$. Initially, the doping concentration could be uniform, although this is not required. Later process steps may cause the doping profile to take on a shape such as depicted in FIGS. 2A-2F for example.

In step 708, material is deposited for a fifth semiconductor region 246. For example, a layer of silicon or another semiconductor is deposited. The fifth semiconductor region 246 may be doped for the first conductivity while depositing the semiconductor or afterwards. An example doping concentration for the fifth semiconductor region 246 is $1.0 \times 10^{21}/cm^3$. Initially, the doping concentration could be uniform, although this is not required. Later process steps may cause the doping profile to take on a shape such as depicted in FIGS. 2A-2G, for example.

In step 612, a thermal anneal may be performed. In step 614, patterning and etching is performed to form punch-through diodes 204. Therefore, process 600 may be used to form punch-through diodes 204. Note that in some embodiments, additional layers of materials are deposited prior to the pattern and etch such that memory cells 200 such as depicted in FIG. 1 might be formed. For example, the same pattern and etch can be used to form many memory cells 200.

In one variation of process 700, step 706 is performed after depositing the material for the fifth semiconductor region 246. In this case, the doping of the fifth semiconductor region 246 may be performed after depositing the semiconductor for the fifth region 246.

Figure 8:
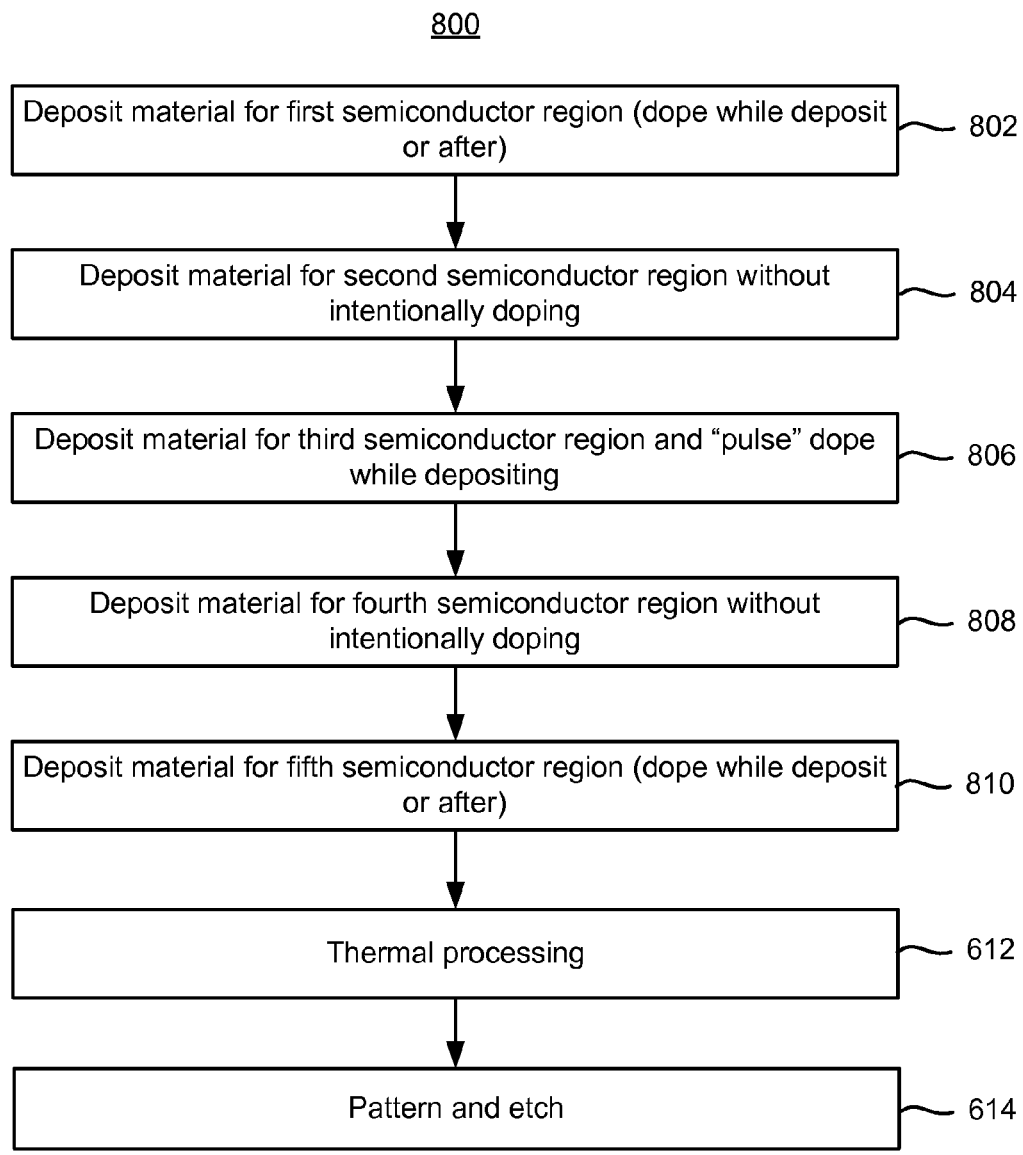
FIG. 8 is a flowchart of one embodiment of a process of fabricating and doping punch-through diodes that includes unintentional doping.

FIG. 8 is a flowchart of one embodiment of a process 800 of forming a punch-through diode 204. Process 800 discusses ways in which doping may be performed. In process 800, the two lightly doped regions 243, 245 are not intentionally doped. However, a light doping level may result anyway. In some embodiments, this may result in a lightly doped n− region. However, a light p-type doping profile may also occur. Process 800 may be used to fabricate a diode 204 such as the embodiments of FIGS. 1-1D.

In step 802, material is deposited for a first semiconductor region 242. For example, a layer of silicon or another semiconductor is deposited. The first semiconductor region 242 may be doped for a first conductivity while depositing the semiconductor or afterwards. An example doping concentration for the first semiconductor region 242 is $1.0 \times 10^{21}/cm^3$. Initially, the doping concentration could be uniform, although this is not required. Later process steps may cause the doping profile to take on a shape such as depicted in FIGS. 2A-2G, for example.

In step 804, material is deposited for a second semiconductor region 243. For example, a layer of silicon or another semiconductor is deposited. In this embodiment, the second semiconductor region 243 is not intentionally doped during deposition. As noted above, this may result in a light n− doping in some embodiments.

In step 806, material is deposited for a third semiconductor region 244. For example, a layer of silicon or another semiconductor is deposited. In this embodiment, the third semiconductor region 244 may be doped for the second conductivity while depositing the semiconductor. An example range of doping concentrations for the third semiconductor region 244 is between $1.0 \times 10^{18}/cm^3$ and $8.0 \times 10^{18}/cm^3$. Initially, the doping concentration could be uniform, although this is not required. Later process steps may cause the doping profile to take on a shape such as depicted in FIGS. 2A-2G, for example.

In step 808, material is deposited for a fourth semiconductor region 245. For example, a layer of silicon or another semiconductor is deposited. In this embodiment, the second semiconductor region 245 is not intentionally doped during deposition. As noted above, this may result in a light n− doping in some embodiments.

In step 810, material is deposited for a fifth semiconductor region 246. For example, a layer of silicon or another semiconductor is deposited. The fifth semiconductor region 246 may be doped for the first conductivity while depositing the semiconductor or afterwards. An example doping concentration for the fifth semiconductor region 246 is $1.0 \times 10^{21}/cm^3$. Initially, the doping concentration could be uniform, although this is not required. Later process steps may cause the doping profile to take on a shape such as depicted in FIGS. 2A-2G, for example.

In step 612, a thermal anneal may be performed. In step 614, patterning and etching is performed to form punch-through diodes 204. Therefore, process 600 may be used to form punch-through diodes 204. Note that in some embodiments, additional layers of materials are deposited prior to the pattern and etch such that memory cells 200 such as depicted in FIG. 1 might be formed. For example, the same pattern and etch can be used to form many memory cells 200.

Figure 9:
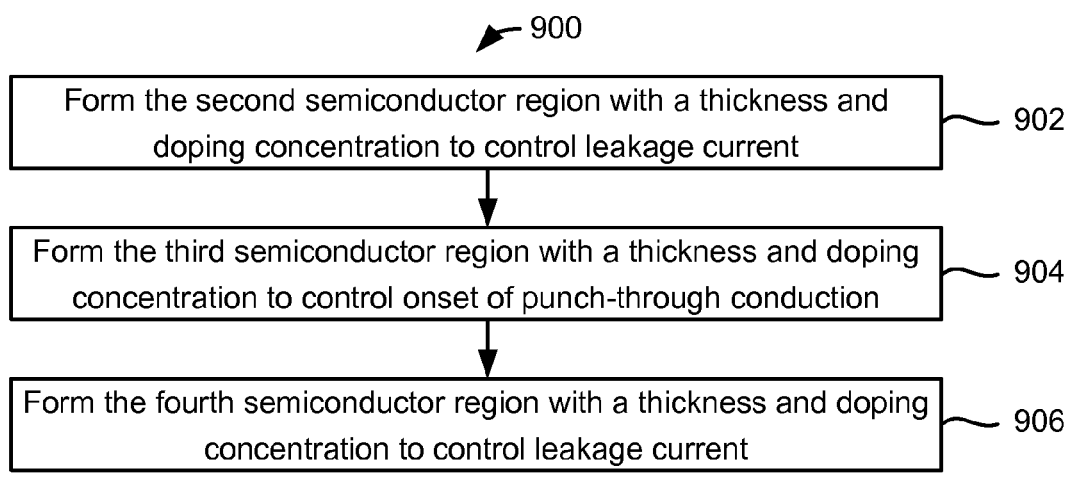
FIG. 9 is a flowchart of one embodiment of a process of forming a punch-through diode in a way to improve Ion/Ioff.

FIG. 9 is a flowchart of one embodiment of a process 900 of forming a punch-through diode 204 in a way to improve Ion/Ioff. Process 900 describes forming the second, third and fourth regions 243, 244, 245. Process 900 involves using such parameters as the thickness and doping concentration of the second, third and fourth regions 243, 244, 245 to improve Ion/Ioff. For example, the onset of punch-through conduction might be controlled by suitable selection of thickness and doping concentration. As another example, leakage current may be reduced by suitable selection of thickness and doping concentration. Process 900 is one embodiment of steps 504-508 of process 500. Process 900 may be used to form any of the diodes in FIGS. 1-1D. The diode may have any of the doping profiles depicted in FIGS. 2A-2G, or another profile.

In step 902, a second semiconductor region 243 is formed with a thickness and doping concentration to control leakage current. For example, a doping concentration in lightly doped region 243 may be calculated to reduce the peak electric field at the p-n junction. This, in turn, may help to reduce leakage current. As noted herein, in some embodiments, the diode 204 has light doping in lightly doped region 243. It may be stated that this results in a graded doping profile at the p-n junction. The amount of grading of the doping profile may be used to achieve a desired electric field at the p-n junction. A suitable width of the second semiconductor region 243 may also be selected to control leakage current.

Note that the second semiconductor region 243 might be in the emitter/collector or in the base. In other words, it may be on either side of the p-n junction. For example, in FIG. 2A, the lightly doped regions 243, 245 are on the base side of the p-n junctions. In contrast, in FIG. 2B, the lightly doped regions 243, 245 are on the emitter/collector side of the p-n junctions.

In step 904, a third semiconductor region 244 is formed with a thickness and doping concentration to control the onset of punch-through conduction. For example, a lower peak doping concentration may be used to cause punch-through conduction to occur at lower voltages. Conversely, a higher peak doping concentration may be used to cause punch-through conduction to occur at higher voltages. Referring to FIG. 2C, several examples are shown of different peak doping concentrations 233, 235, 237.

The width of the third semiconductor region 244 might also be used to control the onset of punch-through conduction. For example, referring to FIG. 2D, two example widths for the moderately doped region (e.g., the third semiconductor region 244) are depicted 244a, 244b.

In step 906, a fourth semiconductor region 245 is formed with a thickness and doping concentration to control leakage current. For example, a doping concentration in lightly doped region 245 may be calculated to reduce the peak electric field at the p-n junction. This, in turn, may help to reduce leakage current. A suitable width of the second semiconductor region 243 may also be selected to control leakage current.

Note that forming any of the heavily doped regions 242, 246, lightly doped regions 243, 245, and moderately doped region 244 may be achieved by multiple doping steps. For example, lightly doped region 243 could be formed in part by in-situ doping and in part by implantation. A portion of lightly doped region 243 might be deposited without any intentional doping and another part of lightly doped region 243 might be depositing with intentional doping. After depositing the lightly doped region 243 for this latter example, implantation of a dopant might or might not be performed. Other regions 242, 244, 245, 246 may also be formed using different doping strategies for different parts of the given region.

Memory Cell and System

Various embodiments of punch-through diodes 204 described herein may be used in a memory system that has memory cells that each have a reversible resistivity-switching element 202 coupled in series with a punch-through diode 204. The punch-through diode 204 may be used as what is referred to as a "steering element." Examples of memory cells and systems will now be described.

For some applications, it may be desirable to reduce the overall height of the memory cell 200. In this case, reducing the overall height of the memory cell 200 could be achieved by reducing the height of the diode 204. However, for some diodes, reducing the height may decrease the Ion/Off ratio. Therefore, embodiments herein which improve the Ion/Ioff ratio may allow the height of the diode 204 to be reduced while still achieving a satisfactory ratio Ion/Ioff. This may allow the memory array to be scaled down in height.

Figure 10A:
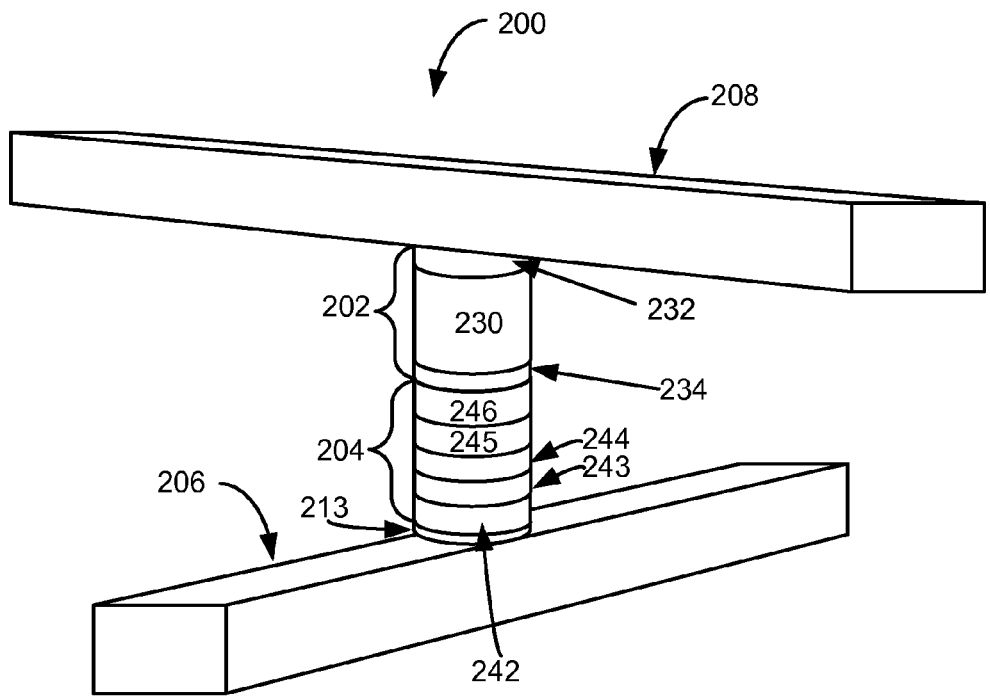
FIG. 10A is a simplified perspective view of one embodiment of a memory cell with a punch-through diode as a steering element.

FIG. 10A is a simplified perspective view of one embodiment of a memory cell 200 which includes a reversible resistivity-switching element 202 coupled in series with a steering element 204 between a first conductor 206 and a second conductor 208. Any of the example punch-through diodes 204 described herein may be used for the steering element 204. It will be understood that the punch-through diodes 204 described herein are for purposes of illustration. Therefore, the steering element 204 is not limited to the example punch-through diodes 204 described herein.

Reversible resistivity-switching element 202 includes reversible resistivity-switching material 230 having a resistance that may be reversibly switched between two or more states. For example, the reversible resistivity-switching material may be in an initial high-resistance state upon fabrication that is switchable to a low-resistance state upon application of a first physical signal. For example, the device may switch states in response to application of a first amount of energy, charge, heat, voltage, current or other phenomena. Application of a second amount of energy, charge, heat, voltage, current or other phenomena may return the reversible resistivity-switching material to the high-resistance state. Alternatively, the reversible resistivity-switching element may be in an initial low-resistance state upon fabrication that is reversibly switchable to a high-resistance state upon application of the appropriate energy, charge, heat, voltage, current or other phenomena. When used in a memory cell, one resistance state may represent a binary "0" while another resistance state may represent a binary "1." However, more than two data/resistance states may be used. Numerous reversible resistivity-switching materials and operation of memory cells employing reversible resistivity-switching materials are described, for example, in U.S. Patent Application Publication 2006/0250836, previously incorporated.

In one embodiment, the process of switching the resistance from the high-resistance state to the low-resistance state is referred to as SETTING the reversible resistivity-switching element 202. The process of switching the resistance from the low-resistance state to the high-resistance state is referred to as RESETTING the reversible resistivity-switching element 202. The high-resistance state may be associated with binary data "0" and the low-resistance state is associated with binary data "1." In other embodiments, SETTING and RESETTING and/or the data encoding can be reversed.

In some embodiments, reversible resistivity-switching material 230 may be formed from a metal oxide. Various different metal oxides can be used. More information about fabricating a memory cell using reversible resistivity-switching material can be found in United States Patent Application Publication 2009/0001343, filed on Jun. 29, 2007, entitled "Memory Cell that Employs a Selectively Deposited Reversible Resistance Switching Element and Methods of Forming the Same," which is hereby incorporated herein by reference in its entirety.

Reversible resistivity-switching element 202 includes electrodes 232 and 234. Electrode 232 is positioned between reversible resistivity-switching material 230 and conductor 208. In one embodiment, electrode 232 is made of TiN. Electrode 234 is positioned between reversible resistivity-switching material 230 and diode 204. In one embodiment, electrode 234 is made of Titanium Nitride, and serves as a barrier layer.

Conductors 206 and 208 may include any suitable conductive material such as tungsten, any appropriate metal, heavily-doped semiconductor material, a conductive silicide, a conductive silicide-germanide, a conductive germanide, or the like. In the embodiment of FIG. 10A, conductors 206 and 208 are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with conductors 206 and 208 to improve device performance and/or aid in device fabrication.

While the reversible resistivity-switching element 202 is shown as being positioned above the punch-through diode steering element 204 in FIG. 10A, it will be understood that in alternative embodiments, the reversible resistivity-switching element 202 may be positioned below the punch-through diode steering element 204.

Figure 10B:
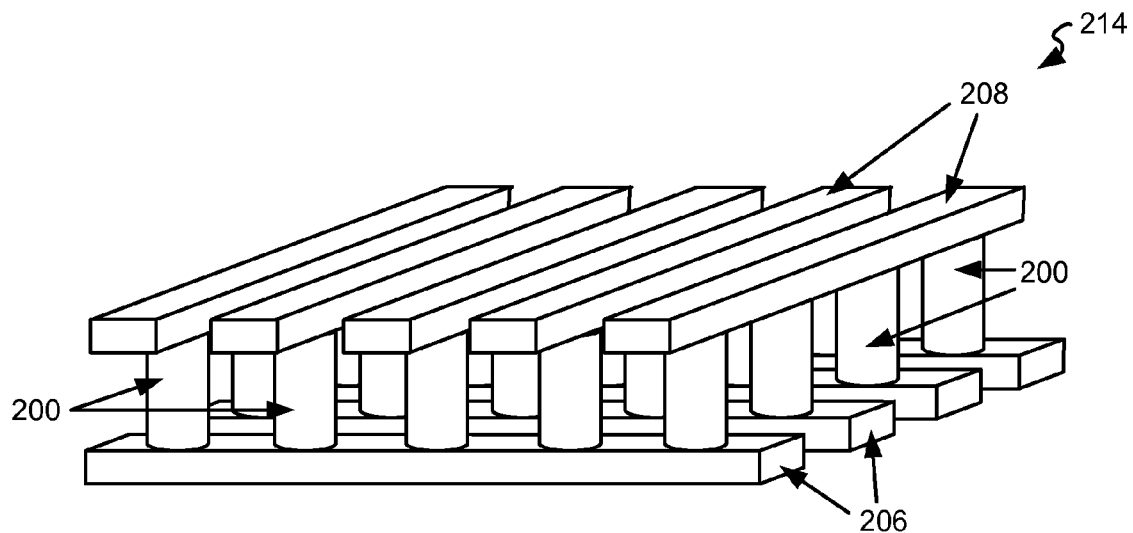
FIG. 10B is a simplified perspective view of a portion of a first memory level formed from a plurality of the memory cells.

FIG. 10B is a simplified perspective view of a portion of a first memory level 214 formed from a plurality of the memory cells 200 of FIG. 10A. For simplicity, the reversible resistivity-switching element 202 and the punch-through diode steering element 204 are not separately shown. The memory array 214 is a "cross-point" array including a plurality of first conductors 206 (e.g., bit lines) and a plurality of second conductors 208 (e.g., word lines) between which multiple memory cells are coupled (as shown). Other memory array configurations may be used, as may multiple levels of memory.

Figure 10C:
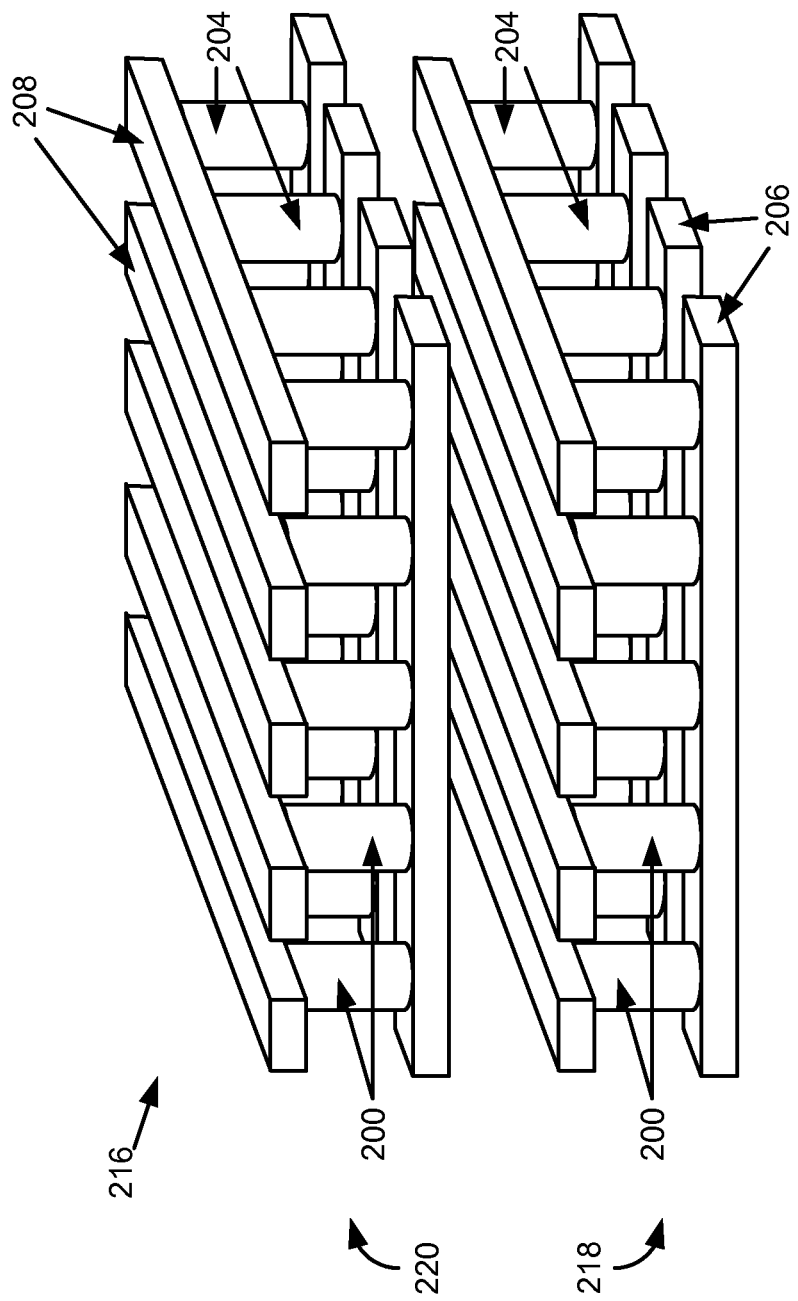
FIG. 10C is a simplified perspective view of a portion of a three-dimensional memory array.

FIG. 10C is a simplified perspective view of a portion of a monolithic three-dimensional array 216 that includes a first memory level 218 positioned below a second memory level 220. In the embodiment of FIG. 10C, each memory level 218 and 220 includes a plurality of memory cells 200 in a cross-point array. It will be understood that additional layers (e.g., an inter-level dielectric) may be present between the first and second memory levels 218 and 220, but are not shown in FIG. 10C for simplicity. Other memory array configurations may be used, as may additional levels of memory.

Figure 10D:
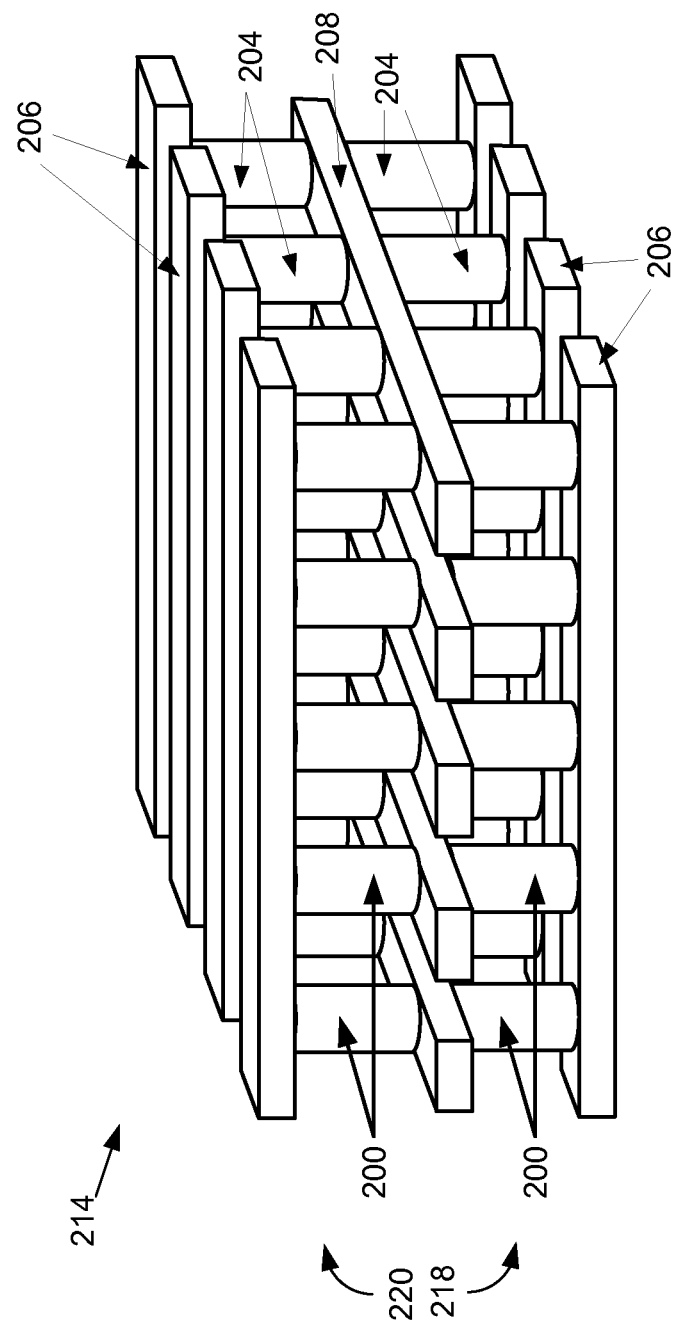
FIG. 10D is a simplified perspective view of a portion of a three-dimensional memory array.

In some embodiments, the memory levels may be formed as described in U.S. Pat. No. 6,952,030, "High-Density Three-Dimensional Memory Cell," which is hereby incorporated by reference herein in its entirety. For instance, the upper conductors of a first memory level may be used as the lower conductors of a second memory level that is positioned above the first memory level as shown in FIG. 10D.

A monolithic three-dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three Dimensional Structure Memory." The substrates may be thinned or removed from the memory levels before bonding, but as the memory levels are initially formed over separate substrates, such memories are not true monolithic three dimensional memory arrays.

FIGS. 10A-10D show memory cells in a cylindrical shape and conductors in the shapes of rails according to the disclosed arrangements. However, the technology described herein is not limited to any one specific structure for a memory cell. Other structures can also be used to form memory cells that include reversible resistivity-switching material. For example, the following patents provide examples of structures of memory cells that can be adapted to use reversible resistivity-switching material: U.S. Pat. No. 6,952,043; U.S. Pat. No. 6,951,780; U.S. Pat. No. 6,034,882; U.S. Pat. No. 6,420,215; U.S. Pat. No. 6,525,953; and U.S. Pat. No. 7,081,377.

Figure 11:
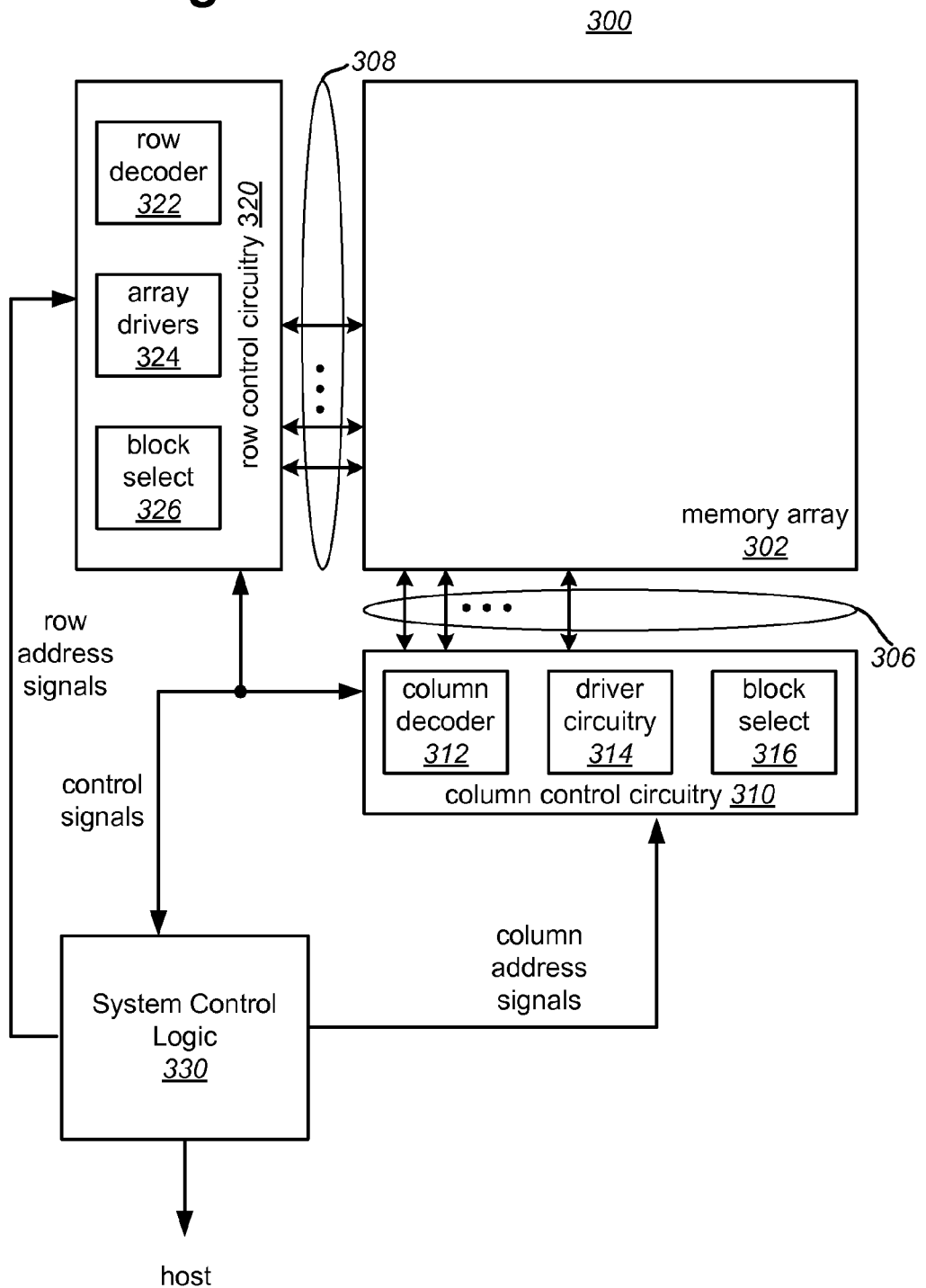
FIG. 11 is a block diagram of one embodiment of a memory system.

FIG. 11 is a block diagram that depicts one example of a memory system 300 that can implement the technology described herein. Memory system 300 includes a memory array 302 that can be a two or three-dimensional array of memory cells as described above. In one embodiment, memory array 302 is a monolithic three-dimensional memory array. The array terminal lines of memory array 302 include the various layer(s) of word lines organized as rows, and the various layer(s) of bit lines organized as columns. However, other orientations can also be implemented.

Memory system 300 includes row control circuitry 320, whose outputs 308 are connected to respective word lines of the memory array 302. Row control circuitry 320 receives a group of M row address signals and one or more various control signals from System Control Logic circuit 330, and typically may include such circuits as row decoders 322, array terminal drivers 324, and block select circuitry 326 for both read and programming (e.g., SET and RESET) operations. Memory system 300 also includes column control circuitry 310 whose input/outputs 306 are connected to respective bit lines of the memory array 302. Column control circuitry 306 receives a group of N column address signals and one or more various control signals from System Control Logic 330, and typically may include such circuits as column decoders 312, array terminal receivers or drivers 314, block select circuitry 316, as well as read/write circuitry, and I/O multiplexers. System control logic 330 receives data and commands from a host and provides output data to the host. In other embodiments, system control logic 330 receives data and commands from a separate controller circuit and provides output data to that controller circuit, with the controller circuit communicating with the host. System control logic 330 may include one or more state machines, registers and other control logic for controlling the operation of memory system 300.

Integrated circuits incorporating a memory array usually subdivide the array into a number of sub-arrays or blocks. Blocks can be further grouped together into bays that contain, for example, 16, 32, or a different number of blocks. Each block in a 3-D memory may have many layers of memory cells. For example, a block might include 8 layers. Each layer may include hundreds, or thousands of bit lines and word lines. For example, a layer might have about a thousand bit lines and about 8 thousand word lines. In some implementations, there is a bit line driver associated with each bit line. Note that a given driver could be shared between two or more bit lines. Also note that it is not required that a given bit line have only one driver associated therewith. In some implementations, some of the drivers are physically located on one side of the memory array and other drivers on the opposite side of the memory array.

As frequently used, a sub-array is a contiguous group of memory cells having contiguous word and bit lines generally unbroken by decoders, drivers, sense amplifiers, and input/output circuits. This is done for any of a variety of reasons. For example, the signal delays traversing down word lines and bit lines which arise from the resistance and the capacitance of such lines (i.e., the RC delays) may be very significant in a large array. These RC delays may be reduced by subdividing a larger array into a group of smaller sub-arrays so that the length of each word line and/or each bit line is reduced. As another example, the power associated with accessing a group of memory cells may dictate an upper limit to the number of memory cells which may be accessed simultaneously during a given memory cycle. Consequently, a large memory array is frequently subdivided into smaller sub-arrays to decrease the number of memory cells which are simultaneously accessed. Nonetheless, for ease of description, an array may also be used synonymously with sub-array to refer to a contiguous group of memory cells having contiguous word and bit lines generally unbroken by decoders, drivers, sense amplifiers, and input/output circuits. An integrated circuit may include one or more than one memory array.

In one embodiment, all of the components depicted in FIG. 5 are arranged on a single integrated circuit. For example, system control logic 330, column control circuitry 310, and row control circuitry 320 are formed on the surface of a substrate and memory array 302 is a monolithic three dimensional memory array formed above the substrate (and, therefore, above system control logic 330, column control circuitry 310 and row control circuitry 320). In some cases, a portion of the control circuitry can be formed on the same layers as some of the memory array 302.

As described above, reversible resistivity-switching element 202 may be reversibly switched between two or more states. For example, the reversible resistivity-switching material may be in an initial, high-resistance state upon fabrication that is switchable to a low-resistance state upon application of a first amount of energy, charge, heat, voltage and/or current. Application of a second amount of energy, charge, heat, voltage and/or current may return the reversible resistivity-switching material to a high-resistance state.

FIG. 12 depicts a circuit that illustrates one embodiment for reading the state of a memory cell. FIG. 12 shows a portion of a memory array including memory cells 450, 452, 454 and 456. In FIG. 12, the diode steering elements of the memory cells are depicted as NPN punch-through diodes. However, PNP punch-through diodes could be used. Two of the many bit lines and two of the many word lines are depicted. A read circuit for one of the bit lines is depicted to be connected to the bit line via transistor 458, which is controlled by a gate voltage supplied by column decoder 312 in order to select or unselect the corresponding bit line. Transistor 458 connects the bit line to a Data bus. Write circuit 460 (which is part of system control logic 330) is connected to the Data bus. Transistor 462 connects to the Data bus and operates as a clamp device that is controlled by clamp control circuit 464 (which is part of system control logic 330). Transistor 462 is also connected to comparator 466 and reference current supply $I_{REF}$. The output of comparator 466 is connected to a data out terminal (to system control logic 330, a controller and/or a host) and to data latch 468. Write circuit 460 is also connected to data latch 468.

The circuit of FIG. 12 has an auto-zero mechanism 492 that compensates for current from non-selected memory elements during a read of a selected memory element. The auto-zero mechanism 492 is connected to the Vsense node and operates to sample and hold a physical condition (e.g., charge) that represents the current from non-selected memory elements. The sample and hold may be performed prior to reading a selected memory cell. When reading a selected memory cell, the auto-zero mechanism 492 outputs a current, Icomp, to compensate for the current from the non-selected memory elements on the selected bit line.

During the auto-zero operation all word lines (WL) are at an unselected voltage about 70% of a Vread that is applied to the data bus. The bit line current from all cells on the selected bit line (BL) flows through clamp device 462 and pulls down Vsense until an equilibrium voltage is reached on Vsense. During the data sensing operation the auto-zero mechanism 492 outputs $I_{COMP}$, which supplies the current that flowed during auto-zero operation and therefore compensates for current from non-selected memory elements. Further details of the auto-zero mechanism 492 are discussed below in connection with the example read process of FIG. 8 and in the example circuit of FIG. 13. Note that the auto-zero mechanism 492 is not a requirement.

Basic data sensing operation of FIG. 12 will now be discussed. When attempting to read the state of the reversible resistivity-switching element, all word lines (WL) are first biased at Vread (e.g., approximately 5 volts) and all bit lines are biased at an un-selected BL voltage of 0.5 times Vread. The selected word line (WL) is then pulled to ground. For example purposes, this discussion will assume that memory cell 450 is selected for reading. One or more selected bit lines (BL) are pulled to Vread through the data bus (by turning on transistor 458) and the clamp device (transistor 462, which receives ~5 volts+Vt). The clamp device's gate is above Vread but controlled to keep the selected bit line (BL) near Vread. During the data sensing operation the sample and hold circuit 467 does not sample Vsense. In an auto-zero embodiment, auto-zero mechanism 492 outputs $I_{COMP}$ which supplies the current that flowed during auto-zero operation and therefore compensates for current from non-selected memory elements. Current is pulled by the selected memory cell through transistor 462 from the $V_{SENSE}$ node. The $V_{SENSE}$ node also receives a reference current $I_{REF}$ that is between a high-resistance state current and a low-resistance state current. In the auto-zero embodiment, the Vsense node also receives Icomp. The $V_{SENSE}$ node moves corresponding to the current difference between the cell current and the reference current $I_{REF}$. Comparator 466 generates a data out signal by comparing the $V_{SENSE}$ voltage to a Vref-read voltage. If the memory cell current is larger than $I_{REF}$, the memory cell is in the low-resistance state and the voltage at $V_{SENSE}$ will be lower than $V_{REF}$. If the memory cell current is smaller than $I_{REF}$, the memory cell is in the high-resistance state and the voltage at $V_{SENSE}$ will be higher than $V_{REF}$. The data out signal from comparator 466 is latched in data latch 468. In some embodiments, the reference current is based on the address of the memory cell.

One embodiment includes a method of forming a punch-through diode. The method includes forming a first semiconductor region of a first conductivity type and having a first peak impurity concentration, forming a second semiconductor region adjacent to the first semiconductor region and having a second peak impurity concentration that is less than the first peak impurity concentration, forming a third semiconductor region of a second conductivity type adjacent to the second semiconductor region and having a third peak impurity concentration that is greater than the second peak impurity concentration, forming a fourth semiconductor region adjacent to the third semiconductor region and having a fourth peak impurity concentration that is less than the third peak impurity concentration, and forming a fifth semiconductor region of the first conductivity type adjacent to the fourth semiconductor region and having a fifth peak impurity concentration that is greater than the peak third impurity concentration.

One embodiment includes a punch-through diode comprising a first semiconductor region of a first conductivity type and having a first peak impurity concentration; a second semiconductor region adjacent to the first semiconductor region and having a second peak impurity concentration that is less than the first peak impurity concentration; a third semiconductor region of a second conductivity type adjacent to the second semiconductor region and having a third peak impurity concentration that is greater than the second peak impurity concentration; a fourth semiconductor region adjacent to the third semiconductor region and having a fourth peak impurity concentration that is less than the third peak impurity concentration; and a fifth semiconductor region of the first conductivity type adjacent to the fourth semiconductor region and having a fifth peak impurity concentration that is greater than the third peak impurity concentration.

One embodiment includes a method of forming a non-volatile storage element comprising forming a memory element having a reversible resistivity switching material; and forming a punch-through diode in series with the memory element. Forming the punch-through diode includes forming a first emitter/collector including a semiconductor material that is heavily-doped with an impurity having a first conductivity; forming a second emitter/collector including a semiconductor material that is heavily-doped with an impurity having the first conductivity; and forming a base having a first p-n junction with the first emitter/collector and a second p-n junction with the second emitter/collector. The forming of one or more of the first emitter/collector, the second emitter/collector, and the base includes forming a first region having a first thickness and a first doping concentration to control an off-current of the punch-through diode and forming a second region having a second thickness and a second doping concentration to control an off-current of the punch-through diode.

One embodiment includes a non-volatile storage element comprising a memory element having a reversible resistivity switching material, and a punch-through diode in series with the memory element. The punch-through diode includes a first emitter/collector including a semiconductor material that is heavily-doped with an impurity having a first conductivity; a second emitter/collector including a semiconductor material that is heavily-doped with an impurity having the first conductivity; and a base having a first p-n junction with the first emitter/collector and a second p-n junction with the second emitter/collector. The punch-through diode has a first region having a first thickness and a first doping concentration to control an off-current of the punch-through diode and a second first region having a second thickness and a second doping concentration to control the off-current of the punch-through diode, either the first and second regions are in the base or the first region is in the first emitter/collector and the second region is in the second emitter/collector.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method of forming a punch-through diode comprising:
   forming a first semiconductor region of a first conductivity type and having a first peak impurity concentration;
   forming a second semiconductor region of a second conductivity type adjacent to the first semiconductor region and having a second peak impurity concentration that is less than the first peak impurity concentration, including depositing a semiconductor for the second semiconductor region while doping the second semiconductor region with an impurity having the second conductivity type at a level of the second peak impurity concentration;
   forming a third semiconductor region of the second conductivity type adjacent to the second semiconductor region and having a third peak impurity concentration that is greater than the second peak impurity concentration, including depositing a semiconductor for the third semiconductor region while doping the third semiconductor region with an impurity having the second conductivity type, the doping the third semiconductor region includes increasing the impurity in the third semiconductor region to a level of the third peak impurity concentration;
   forming a fourth semiconductor region of the second conductivity type adjacent to the third semiconductor region and having a fourth peak impurity concentration that is approximately the second peak impurity concentration, including depositing a semiconductor for the fourth semiconductor region while doping the fourth semiconductor region with an impurity having the second conductivity type, the doping the fourth semiconductor region includes decreasing the impurity in the fourth semiconductor region to a level of the fourth peak impurity concentration; and
   forming a fifth semiconductor region of the first conductivity type adjacent to the fourth semiconductor region and having a fifth peak impurity concentration that is approximately the first peak impurity concentration.

2. A method as recited in claim 1, wherein the impurity having the second conductivity type includes one or more of boron, boron fluoride, or indium.

3. A method as recited in claim 1, wherein the impurity having the second conductivity type includes one or more of phosphorous, arsenic, or antimony.

4. A method as recited in claim 1, further comprising forming a memory element having a reversible resistivity switching material in series with the punch-through diode.

5. A method as recited in claim 1, wherein the forming a third semiconductor region further includes forming a sixth peak impurity concentration that is greater than the second peak impurity concentration.

6. A punch-through diode comprising:
   a first semiconductor region of a first conductivity type and having a first peak impurity concentration;
   a second semiconductor region of a second conductivity type adjacent to the first semiconductor region and having a second peak impurity concentration that is less than the first peak impurity concentration;
   a third semiconductor region of the second conductivity type adjacent to the second semiconductor region and having a third peak impurity concentration that is greater than the second peak impurity concentration;

a fourth semiconductor region of the second conductivity type adjacent to the third semiconductor region and having a fourth peak impurity concentration that is less than the third peak impurity concentration, the fourth peak impurity concentration is approximately the second peak impurity concentration; and a fifth semiconductor region of the first conductivity type adjacent to the fourth semiconductor region and having a fifth peak impurity concentration that is approximately the first peak impurity concentration.

7. The punch-through diode of claim 6, wherein the thickness and impurity concentration of the second semiconductor region and the fourth semiconductor region are calculated to reduce leakage current.

8. The punch-through diode of claim 6, wherein the thickness and impurity concentration of the third semiconductor region is calculated to control onset of punch through conduction.

9. The punch-through diode of claim 6, wherein the first semiconductor region is N+, the second semiconductor region is p−, the third semiconductor region is p, the fourth semiconductor region is p−, and the fifth semiconductor region is N+.

10. The punch-through diode of claim 6, wherein the first semiconductor region is P+, the second semiconductor region is n−, the third semiconductor region is n, the fourth semiconductor region is n−, and the fifth semiconductor region is P+.

11. The punch-through diode of claim 6, wherein the third semiconductor region includes a sixth peak impurity concentration that is greater than the second peak impurity concentration, and approximately the third peak impurity concentration.

12. The punch-through diode of claim 6, wherein the peak doping concentration of the third semiconductor region is at least 10 times greater than the peak doping concentration of the second and fourth semiconductor regions.

13. A method of forming a punch-through diode comprising:

forming a first semiconductor region of a first conductivity type and having a first peak impurity concentration;

forming a second semiconductor region adjacent to the first semiconductor region and having a second peak impurity concentration that is less than the first peak impurity concentration, including depositing a semiconductor for the second semiconductor region without intentionally doping;

forming a third semiconductor region of a second conductivity type adjacent to the second semiconductor region and having a third peak impurity concentration that is greater than the second peak impurity concentration, including doping a semiconductor for the third semiconductor region while depositing the semiconductor for the third semiconductor region;

forming a fourth semiconductor region adjacent to the third semiconductor region and having a fourth peak impurity concentration that is less than the third peak impurity concentration, including depositing a semiconductor for the fourth semiconductor region without intentionally doping; and forming a fifth semiconductor region of the first conductivity type adjacent to the fourth semiconductor region and having a fifth peak impurity concentration that is greater than the peak third peak impurity concentration;

performing a thermal anneal after forming the first semiconductor region of the first conductivity type and having the first peak impurity concentration, after doping the semiconductor for the third semiconductor region, and after forming the fifth semiconductor region of the first conductivity type and having the fifth peak impurity concentration, the second semiconductor region has the first conductivity type and the second peak impurity concentration after the thermal anneal, the fourth semiconductor region has the first conductivity type and the fourth peak impurity concentration after the thermal anneal.

14. A method of forming a punch-through diode comprising:

forming a first semiconductor region of a first conductivity type and having a first peak impurity concentration;

forming a second semiconductor region adjacent to the first semiconductor region and having a second peak impurity concentration that is less than the first peak impurity concentration, including depositing a semiconductor for the second semiconductor region without intentionally doping;

forming a third semiconductor region of a second conductivity type adjacent to the second semiconductor region and having a third peak impurity concentration that is greater than the second peak impurity concentration, including depositing a semiconductor for the third semiconductor region without intentionally doping;

forming a fourth semiconductor region adjacent to the third semiconductor region and having a fourth peak impurity concentration that is less than the third peak impurity concentration, including depositing a semiconductor for the fourth semiconductor region without intentionally doping; and forming a fifth semiconductor region of the first conductivity type adjacent to the fourth semiconductor region and having a fifth peak impurity concentration that is greater than the peak third peak impurity concentration;

implanting an impurity having the second conductivity type into the third semiconductor region at a level of at least the third peak impurity concentration after forming the fourth semiconductor region; and performing a thermal anneal after forming the first semiconductor region of the first conductivity type and having the first peak impurity concentration, after implanting the impurity having the second conductivity type, and after forming the fifth semiconductor region of the first conductivity type and having the fifth peak impurity concentration, the second semiconductor region has the first conductivity type and the second peak impurity concentration after the thermal anneal, the fourth semiconductor region has the first conductivity type and the fourth peak impurity concentration after the thermal anneal.

15. The punch-through diode of claim 6, wherein the doping concentration in the second semiconductor region and the fourth semiconductor region has a flat region.

16. The punch-through diode of claim 6, wherein the doping concentration in the first semiconductor region and the fifth semiconductor region is graded with the doping concentration gradually increasing in a direction away from the interface with the second semiconductor region or fourth semiconductor region, respectively.

17. The punch-through diode of claim 16, wherein the doping concentration in the first semiconductor region and the fifth semiconductor region increases by a factor of about 1000 moving away from the second semiconductor region or fourth semiconductor region, respectively.

* * * * *